(12) United States Patent
You

(10) Patent No.: US 12,484,356 B2
(45) Date of Patent: Nov. 25, 2025

(54) DISPLAY DEVICE INCLUDING PADS WITH HOLES

(71) Applicant: Samsung Display Co., LTD., Yongin-si (KR)

(72) Inventor: Chun Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 624 days.

(21) Appl. No.: 17/680,870

(22) Filed: Feb. 25, 2022

(65) Prior Publication Data
US 2023/0017296 A1 Jan. 19, 2023

(30) Foreign Application Priority Data

Jul. 14, 2021 (KR) .................. 10-2021-0092148

(51) Int. Cl.
*H10H 20/857* (2025.01)
*H10H 29/14* (2025.01)

(52) U.S. Cl.
CPC ........ *H10H 20/857* (2025.01); *H10H 29/142* (2025.01)

(58) Field of Classification Search
CPC ..... H01L 33/62; H01L 27/156; H10H 20/857; H10H 29/142
USPC ........................................... 257/79
See application file for complete search history.

(56) References Cited

U.S. PATENT DOCUMENTS

| 2008/0018229 | A1* | 1/2008 | Yamazaki | H10K 59/38 313/498 |
| 2009/0218925 | A1* | 9/2009 | Kwak | H10K 59/131 313/243 |
| 2009/0315451 | A1* | 12/2009 | Choi | H10K 59/131 438/22 |
| 2013/0005064 | A1* | 1/2013 | Park | H10K 59/131 438/34 |
| 2013/0049062 | A1* | 2/2013 | Hatano | H10K 59/131 257/770 |
| 2013/0306939 | A1* | 11/2013 | Park | H01L 27/1259 438/34 |
| 2014/0326974 | A1* | 11/2014 | Yamazaki | H10K 50/8426 257/40 |
| 2014/0367633 | A1* | 12/2014 | Bibl | H01L 33/56 257/13 |
| 2016/0372514 | A1* | 12/2016 | Chang | H01L 27/1259 |
| 2017/0062397 | A1* | 3/2017 | Park | G09F 9/33 |
| 2019/0207143 | A1* | 7/2019 | Chen | H10K 77/10 |

(Continued)

FOREIGN PATENT DOCUMENTS

| CN | 112180128 | 1/2021 |
| KR | 10-0764055 | 10/2007 |

(Continued)

*Primary Examiner* — Eric W Jones
(74) *Attorney, Agent, or Firm* — Sughrue Mion, PLLC

(57) ABSTRACT

A display device includes a display pad disposed on a substrate and including at least one through hole penetrating in a thickness direction of the substrate, at least one first protrusion pattern filling the at least one through hole and protruding above the display pad, a pad connection pattern overlapping the at least one first protrusion pattern and electrically connected to the display pad, and a connection lead of a circuit board, the connection lead being disposed on the pad connection pattern and electrically connected to the pad connection pattern.

21 Claims, 24 Drawing Sheets

(56) References Cited

U.S. PATENT DOCUMENTS

2019/0229176 A1\*   7/2019   Shim .................... H10K 59/124
2019/0237455 A1\*   8/2019   Wu ...................... G02F 1/13306

FOREIGN PATENT DOCUMENTS

KR    10-2009-0123734    12/2009
KR    10-2017-0140764    12/2017

\* cited by examiner

PAD: PAD1, PAD2, PAD3
LD: LD1, LD2, LD3

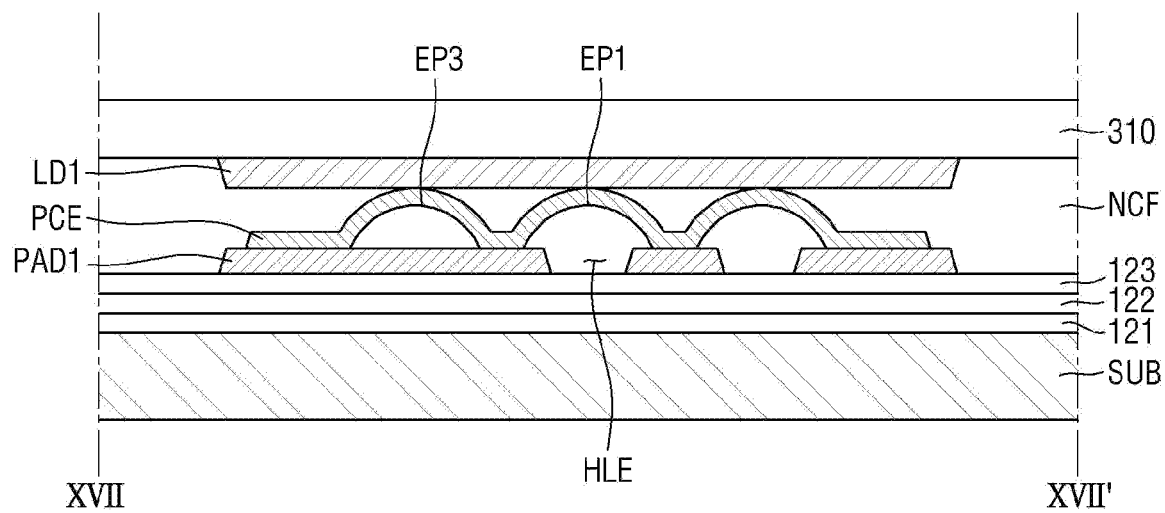
FIG. 17
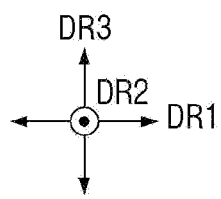

DISPLAY DEVICE INCLUDING PADS WITH HOLES

CROSS-REFERENCE TO RELATED APPLICATION(S)

This application claims priority to and benefits of Korean Patent Application No. 10-2021-0092148 under 35 U.S.C. § 119, filed in the Korean Intellectual Property Office (KIPO) on Jul. 14, 2021, the entire contents of which are incorporated herein by reference.

BACKGROUND

1. Technical Field

The disclosure relates to a display device.

2. Description of the Related Art

As information society develops, the demand for display devices for displaying images has increased and diversified. Display devices may be flat panel displays such as liquid crystal displays (LCDs), field emission displays (FEDs), or light emitting displays (LEDs). Light emitting display devices may include an organic light emitting display device including an organic light emitting diode element as a light emitting element, an inorganic light emitting display device including an inorganic semiconductor element as a light emitting element, or a micro light emitting display device including a micro light emitting diode element as a light emitting element.

Recently, head mounted displays (HMIDs) including light emitting display devices have been developed. A head mounted display (HMD) may be a glasses-type monitor device for virtual reality (VR) or augmented reality (AR) that may be worn in the form of glasses or a helmet by a user and forms a focus at a distance close to the user's eyes and in front of the user's eyes.

A high-resolution micro light emitting diode display panel including a micro light emitting diode element may be applied to head mounted displays. Since the micro light emitting diode element may emit light of a single color, the micro light emitting diode display panel may include a wavelength conversion layer converting a wavelength of light emitted from the micro light emitting diode element in order to display various colors.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device capable of alleviating stress of an elastic projection disposed on a pad part.

Additional features of embodiments will be set forth in the description which follows, and in part may be apparent from the description, or may be learned by practice of an embodiment or embodiments herein.

According to an embodiment, a display device may include a display pad disposed on a substrate and including at least one through hole penetrating in a thickness direction of the substrate, at least one first protrusion pattern filling the at least one through hole and protruding above the display pad, a pad connection pattern overlapping the at least one first protrusion pattern and electrically connected to the display pad, and a connection lead of a circuit board, the connection lead being disposed on the pad connection pattern and electrically connected to the pad connection pattern.

The at least one through hole may include a plurality of through holes, the at least one first protrusion pattern may include a plurality of first protrusion patterns, and the at least one first protrusion pattern may fill the at least one through hole, respectively.

The at least one through hole may have a rectangular shape in a plan view.

The at least one through hole may include a plurality of through holes, the at least one first protrusion pattern may include a plurality of first protrusion patterns, and at least one of the plurality of first protrusion patterns may fill insides of the plurality of through holes.

The at least one through hole may include a first through hole having a first diameter, and a second through hole having a second diameter greater than the first diameter.

The display device may further include a second protrusion pattern disposed on the display pad, the second protrusion pattern not overlapping the at least one through hole.

The display pad may include a pad groove having a shape recessed from a surface of the display pad towards another surface of the display pad, and the at least one first protrusion pattern may fill the pad groove and may protrude above the display pad.

The display pad may include a first stacked conductive layer, and a second stacked conductive layer that may be sequentially stacked on each other, and the at least one through hole may include a first sub-through hole in the first stacked conductive layer, and a second sub-through hole in the second stacked conductive layer.

The display device may further include a first emission area emitting light of a first color, a second emission area emitting light of a second color, and at least one light emitting element disposed in each of the first emission area and the second emission area. The display pad may include a first display pad electrically connected to the at least one light emitting element disposed in the first emission area, and a second display pad electrically connected to the at least one light emitting element disposed in the second emission area.

The first display pad may include a first conductive layer, and the second display pad may include a second conductive layer.

The display device may further include a third emission area emitting light of a third color, and a light emitting element disposed in the third emission area. The display pad may further include a third display pad electrically connected to the light emitting element disposed in the third emission area, and the third display pad may include a third conductive layer.

The display device may further include a display area displaying a screen, and a non-display area disposed adjacent to the display area. The first emission area and the second emission area may be disposed in the display area. The display pad may be disposed in the non-display area.

The at least one light emitting element may include a plurality of light emitting elements.

Each of the at least one light emitting element may be a micro light emitting diode element.

According to an embodiment, a display device may include a first emission area emitting light of a first color, a second emission area emitting light of a second color, at least one light emitting element disposed in each of the first emission area and the second emission area, and a display pad including a first display pad electrically connected to the at least one light emitting element disposed in the first emission area, and a second display pad electrically connected to the at least one light emitting element disposed in the second emission area. Each of the first display pad and the second display pad may include at least one through hole penetrating in a thickness direction. The first display pad may be formed of a first conductive layer, and the second display pad may be formed of a second conductive layer different from the first conductive layer.

The display device may further include a protrusion pattern filling the at least one through hole and protruding above the display pad.

The at least one through hole may be provided in plural and the at least one protrusion pattern may be provided in plural. Each protrusion pattern may fill each through hole.

The display device may further include a pad connection pattern overlapping the protrusion pattern and electrically connected to the display pad, and a connection lead of a circuit board, the connection lead being disposed on the pad connection pattern and electrically connected to the pad connection pattern.

The at least one light emitting element may include a plurality of light emitting elements.

Each of the at least one light emitting element may be a micro light emitting diode element.

According to an embodiment, stress of the elastic protrusion disposed on the pad part may be relieved, and defects such as cracks that may occur in the elastic protrusion may be suppressed or prevented.

Other features and embodiments may be apparent from the following detailed description, the drawings, and the claims.

BRIEF DESCRIPTION OF THE DRAWINGS

The accompanying drawings, which are included to provide a further understanding of the disclosure, illustrate embodiments in which:

FIG. 17 is a schematic cross-sectional view taken along line XVII-XVII' of FIG. 16;

DETAILED DESCRIPTION OF THE EMBODIMENTS

Figure 1:
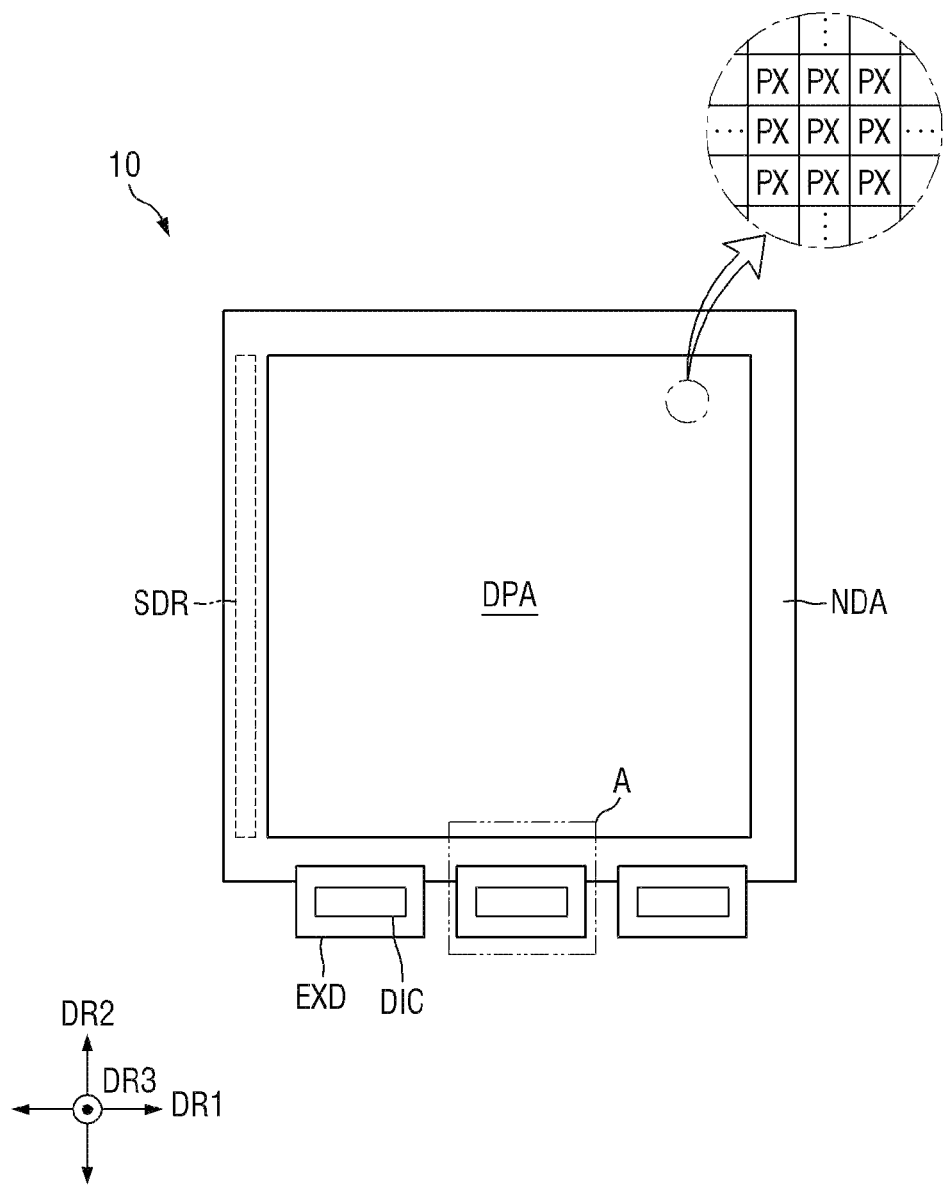
FIG. 1 is a schematic plan view of a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to more clearly describe embodiments of the disclosure.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relationship between one element or component and another element or component as illustrated in the drawings. It will be understood that spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about", "approximately", and "substantially" as used herein are inclusive of the stated value and mean within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within +30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view of a display device according to an embodiment.

Referring to FIG. 1, a display device 10 according to an embodiment may be applied to smartphones, mobile phones, tablet personal computers (PCs), personal digital assistants (PDAs), portable multimedia players (PMPs), televisions, game machines, wrist watch-type electronic devices, head-mounted displays, monitors of personal computers, laptop computers, car navigation systems, vehicle instrument boards, digital cameras, camcorders, external billboards, electric signs, medical devices, inspection devices, various home appliances such as refrigerators and washing machines, or Internet of Things (IoT) devices. In the specification, a television (TV) will be described as an example of the display device, and the TV may have high resolution or ultra-high resolution such as high definition (HD), ultra-high definition (UHD), 4K, or 8K.

The display device 10 according to an embodiment may be variously classified according to a display method. For example, classification of the display device may include an organic light emitting display (OLED), an inorganic light emitting display (inorganic LED), a quantum dot light emitting display (QED), a micro LED display (micro-LED), a nano LED display (nano-LED), a plasma display panel (PDP), a field emission display (FED), a cathode ray tube display (CRT), a liquid crystal display (LCD), an electrophoretic display (EPD), and the like.

Hereinafter, an organic light emitting display device will be described as an example of the display device, and unless a special distinction is required, an organic light emitting display device applied to an embodiment will be simply abbreviated as a display device. However, an embodiment is not limited to the organic light emitting display device, and other display devices listed above or otherwise may be applied within the scope of the disclosure.

In the drawings, a first direction DR1 may refer to a width direction of the display device 10, a second direction DR2 may refer to a length direction of the display device 10, and a third direction DR3 may refer to a thickness direction of the display device 10. "Left", "right", "upper", and "lower" may refer to directions when the display device 10 may be viewed in plan view. For example, "right side" may refer to a side in the first direction DR1, "left side" may refer to the other side in the first direction DR1, "upper side" may refer to a side in the second direction DR2, and "lower side" may refer to the other side in the second direction DR2. "Upper portion" may refer to a side in the third direction DR3, and "lower portion" may refer to the other side in the third direction DR3.

The display device 10 according to an embodiment may have a quadrate shape in plan view, for example, a square shape. In case that the display device 10 may be a television, the display device 10 may have a rectangular shape of which long sides may be positioned in the width direction. However, the disclosure is not limited thereto, and the long sides of the display device 10 may be positioned in the length direction or the display device 10 may be rotatably installed, such that the long sides of the display device 10 may be variably positioned in the width or length direction. The display device 10 may have a circular or elliptical shape.

The display device 10 may include a display area DPA and a non-display area NDA. The display area DPA may be an active area in which an image may be displayed. The display area DPA may have a square shape in plan view, similar to the overall shape of the display device 10, but is not limited thereto.

The display area DPA may include pixels PX. The pixels PX may be arranged in a matrix direction. A shape of each pixel PX may be a rectangular shape or a square shape in plan view, but is not limited thereto, and may also be a rhombic shape of which each side may be inclined with respect to a side direction of the display device 10. The pixels PX may include several color pixels PX. For example, the pixels PX may include a first color pixel PX of red, a second color pixel PX of green, and a third color pixel PX of blue, but are not limited thereto. The respective color pixels PX may be alternately arranged in a stripe type or a PenTile® type.

The non-display area NDA may be disposed adjacent to (e.g., around) the display area DPA. The non-display area NDA may entirely or partially surround the display area DPA. The display area DPA may have a square shape, and the non-display area NDA may be disposed adjacent to four sides of the display area DPA. The non-display area NDA may constitute a bezel of the display device 10.

A driving circuit or a driving element for driving the display area DPA may be disposed in the non-display area NDA. In an embodiment, in a non-display area NDA disposed adjacent to a first side (lower side in FIG. 1) of the display device 10, a pad part may be provided on a display substrate 100 (see FIG. 4) of the display device 10, and external devices EXD may be mounted on pad electrodes of the pad part. Examples of the external devices EXD may include a circuit board such as a connection film, a printed circuit board, a connector, a wiring connection film, and the like.

A driving chip DIC may be disposed on the external device EXD. The driving chip DIC may include an integrated circuit driving the display device 10. For example, the driving chip DIC may include an integrated circuit driving the display device 10 and may use a chip on film (COF) method, but is not limited thereto.

A scan driver SDR and the like formed directly on the display substrate of the display device 10 may be disposed in a non-display area NDA disposed adjacent to a second side (left side in FIG. 1) of the display device 10.

Figure 2:
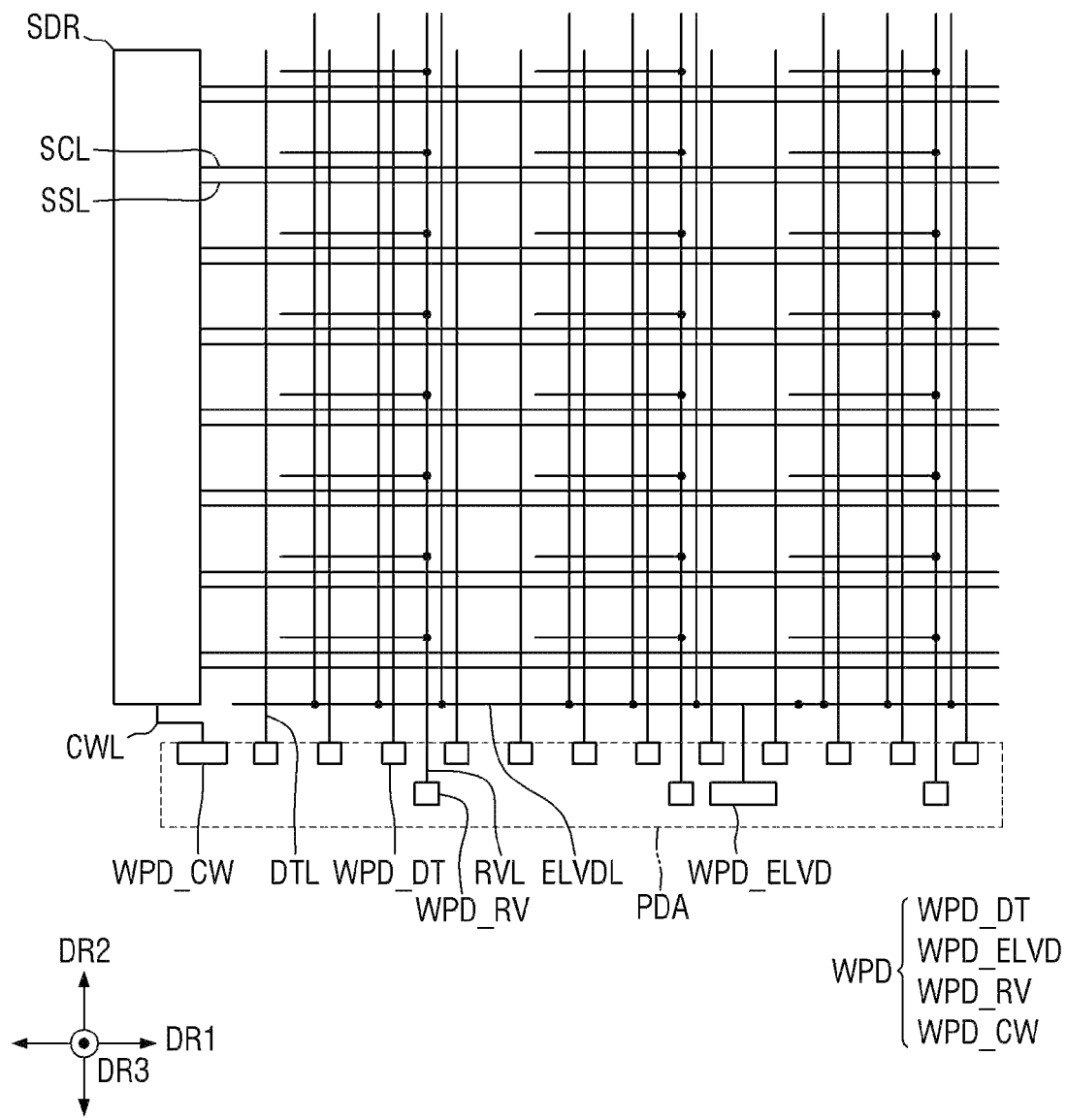
FIG. 2 is a schematic diagram of a circuit of a display substrate of the display device according to an embodiment.

FIG. 2 is a schematic diagram of a circuit of a display substrate of the display device according to an embodiment.

Referring to FIG. 2, wirings may be disposed on a first substrate. The wirings may include scan lines SCL, sensing signal lines SSL, data lines DTL, reference voltage lines RVL, and a first source voltage line ELVDL.

The scan lines SCL and the sensing signal lines SSL may extend in the first direction DR1. The scan lines SCL and the sensing signal lines SSL may be connected to the scan driver SDR. The scan driver SDR may include a driving circuit. The scan driver SDR may be disposed on a side of the non-display area NDA on the display substrate, but is not limited thereto, and may also be disposed on both sides of the non-display area NDA. The scan driver SDR may be connected to a signal connection wiring CWL, and at least one end of the signal connection wiring CWL may be connected to the external device EXD (see FIG. 1) by forming a pad WPD_CW on a first non-display area NDA and/or a second non-display area NDA.

The data lines DTL and the reference voltage lines RVL may extend in the second direction DR2 crossing the first direction DR1. The first source voltage line ELVDL may include portions extending in the second direction DR2. The first source voltage line ELVDL may further include portions extending in the first direction DR1. The first source voltage line ELVDL may have a mesh structure, but is not limited thereto.

Wiring pads WPD may be disposed at one or more ends of the data lines DTL, the reference voltage lines RVL, and the first source voltage line ELVDL. Each wiring pad WPD may be disposed in a pad part PDA of the non-display area NDA. In an embodiment, wiring pads WPD_DT (hereinafter, referred to as 'data pads') of the data lines DTL, wiring pads WPD_RV (hereinafter, referred to as 'reference voltage pads') of the reference voltage lines RVL, and a wiring pad WPD_ELVD (hereinafter, referred to as a 'first source voltage pad') of the first source voltage line ELVDL may be disposed in the pad part PDA of the non-display area NDA. As another example, all of the data pads WPD_DT, the reference voltage pads WPD_RV, and the first source voltage pad WPD_ELVD may be disposed in different non-display areas NDA. As described above, the external device EXD (see FIG. 1) may be mounted on the wiring pad WPD. The external device EXD may be mounted on the wiring pad WPD through an anisotropic conductive film, ultrasonic bonding, or the like.

Each pixel PX on the display substrate may include a pixel driving circuit. The above-described wirings may apply driving signals to the respective pixel driving circuits while passing through the respective pixels PX or around the respective pixels PX. The pixel driving circuit may include a transistor and a capacitor. The numbers of transistors and capacitors in each pixel driving circuit may be variously modified. Hereinafter, the pixel driving circuit will be described using a 3T1C structure in which the pixel driving circuit includes three transistors and one capacitor as an example, but the disclosure is not limited thereto, and structures of various other modified pixels PX such as a 2T1C structure, a 7T1C structure, and a 6T1C structure may also be applied.

Figure 3:
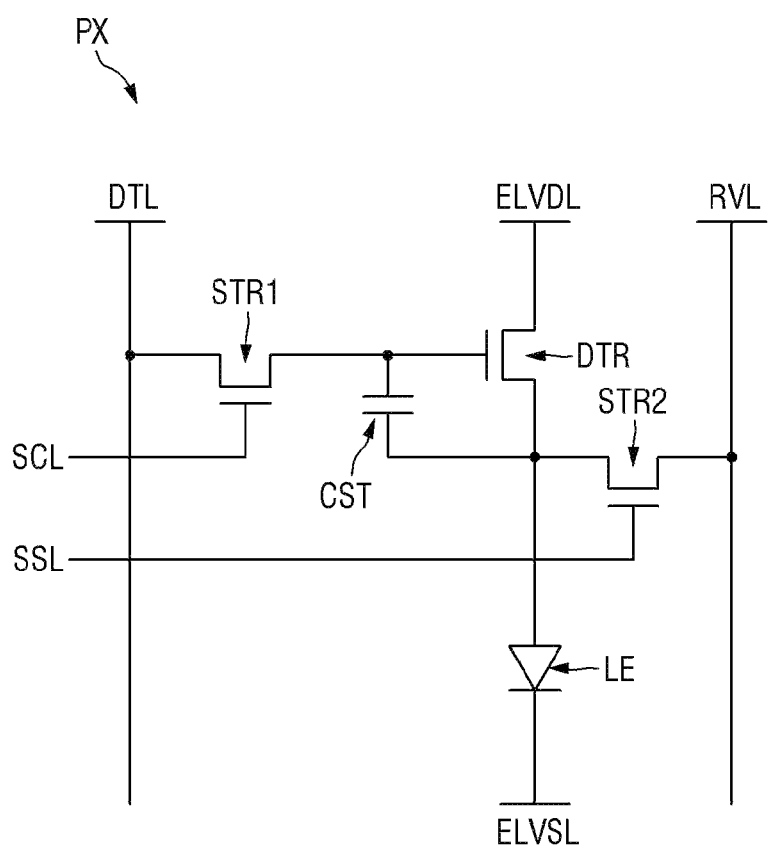
FIG. 3 is a schematic circuit diagram of a pixel of the display device according to an embodiment.

FIG. 3 is a schematic circuit diagram of a pixel of the display device according to an embodiment.

Referring to FIG. 3, each pixel PX of the display device according to an embodiment may include three transistors DTR, STR1, and STR2 and one maintaining capacitor CST, in addition to a light emitting element EL.

The light emitting element LE may emit light according to a current supplied through a driving transistor DTR. The light emitting element LE may be implemented as an inorganic light emitting diode, an organic light emitting diode, a micro light emitting diode, a nano light emitting diode, or the like.

A first electrode (e.g., an anode electrode) of the light emitting element LE may be connected to the source electrode of the driving transistor DTR, and a second electrode (e.g., a cathode electrode) of the light emitting element LE may be connected to a second source voltage line ELVSL to which a low potential voltage (second source voltage) lower than a high potential voltage (first source voltage) of the first source voltage line ELVDL may be supplied.

The driving transistor DTR may adjust a current flowing from the first source voltage line ELVDL to which the first source voltage may be supplied to the light emitting element LE according to a voltage difference between a gate electrode and the source electrode thereof. The gate electrode of the driving transistor DTR may be connected to a first source/drain electrode of a first switching transistor STR1, the source electrode of the driving transistor DTR may be connected to the first electrode of the light emitting element LE, and a drain electrode of the driving transistor DTR may be connected to the first source voltage line ELVDL to which the first source voltage may be applied.

The first switching transistor STR1 may be turned on by a scan signal of the scan line SCL to connect the data line DTL to the gate electrode of the driving transistor DTR. A gate electrode of the first switching transistor STR1 may be connected to the scan line SCL, the first source/drain electrode of the first switching transistor STR1 may be connected to the gate electrode of the driving transistor DTR1, and a second source/drain electrode of the first switching transistor STR1 may be connected to the data line DTL.

A second switching transistor STR2 may be turned on by a sensing signal of the sensing signal line SSL to connect the reference voltage line RVL to the source electrode of the driving transistor DTR. A gate electrode of the second switching transistor STR2 may be connected to the sensing signal line SSL, a first source/drain electrode of the second switching transistor STR2 may be connected to the reference voltage line RVL, and a second source/drain electrode of the second switching transistor STR2 may be connected to the source electrode of the driving transistor DTR.

In an embodiment, the first source/drain electrode of each of the first and second switching transistors STR1 and STR2 may be a source electrode, and the second source/drain electrode of each of the first and second switching transistors STR1 and STR2 may be a drain electrode, but the disclosure is not limited thereto (e.g., the arrangement may be vice versa).

The maintaining capacitor CST may be formed between the gate electrode and the source electrode of the driving transistor DTR. The maintaining capacitor CST may store a difference voltage between a gate voltage and a source voltage of the driving transistor DTR.

The driving transistor DTR and the first and second switching transistors STR1 and STR2 may be formed as thin film transistors. It has been described in FIG. 3 that the driving transistor DTR and the first and second switching transistors STR1 and STR2 may be N-type metal oxide semiconductor field effect transistors (MOSFETs), but the disclosure is not limited thereto. For example, the driving transistor DTR and the first and second switching transistors STR1 and STR2 may be P-type MOSFETs or some of the driving transistor DTR and the first and second switching transistors STR1 and STR2 may be N-type MOSFETs and the others of the driving transistor DTR and the first and second switching transistors STR1 and STR2 may be P-type MOSFETs.

Figure 4:
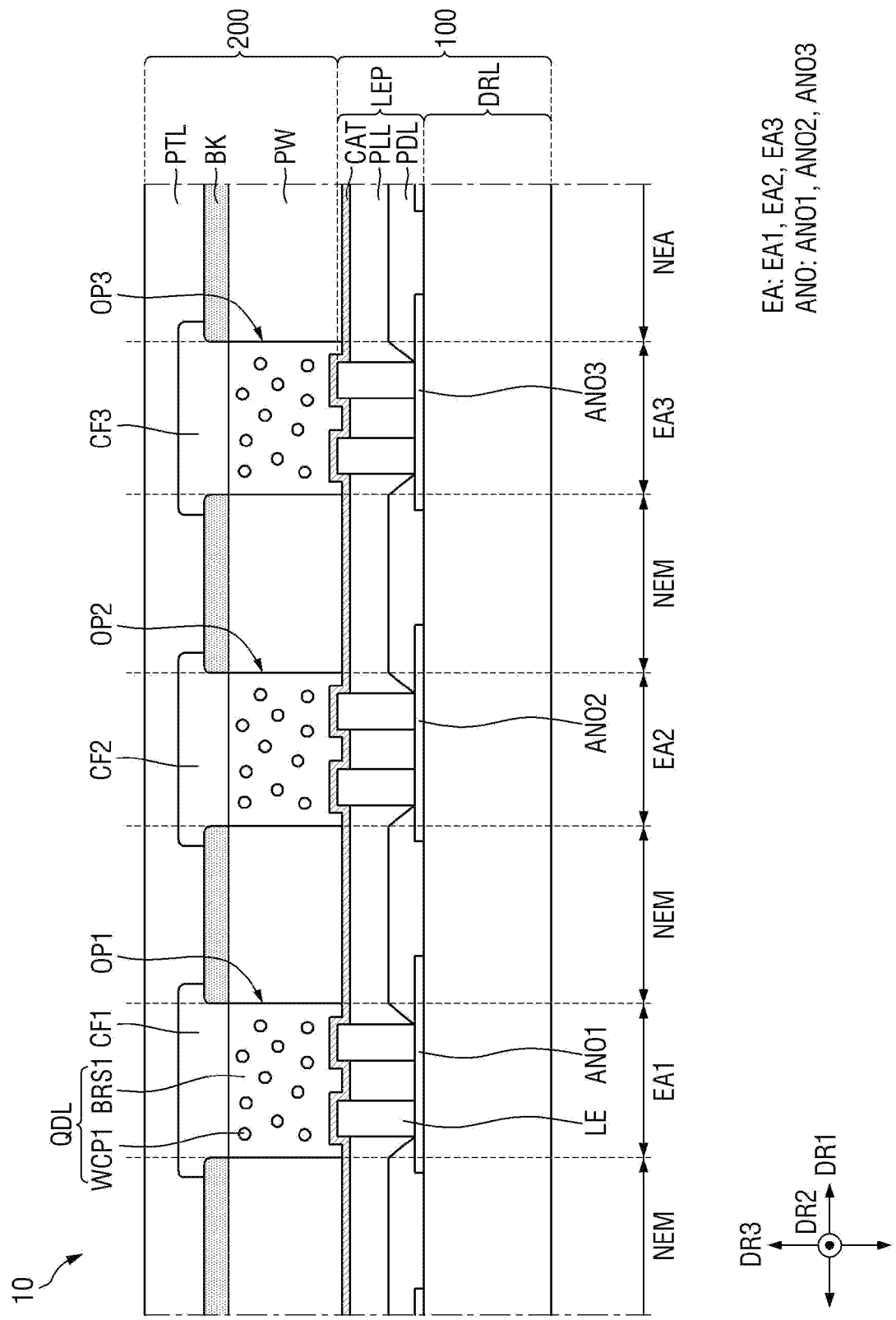
FIG. 4 is a schematic cross-sectional view illustrating the display device according to an embodiment.
Figure 5:
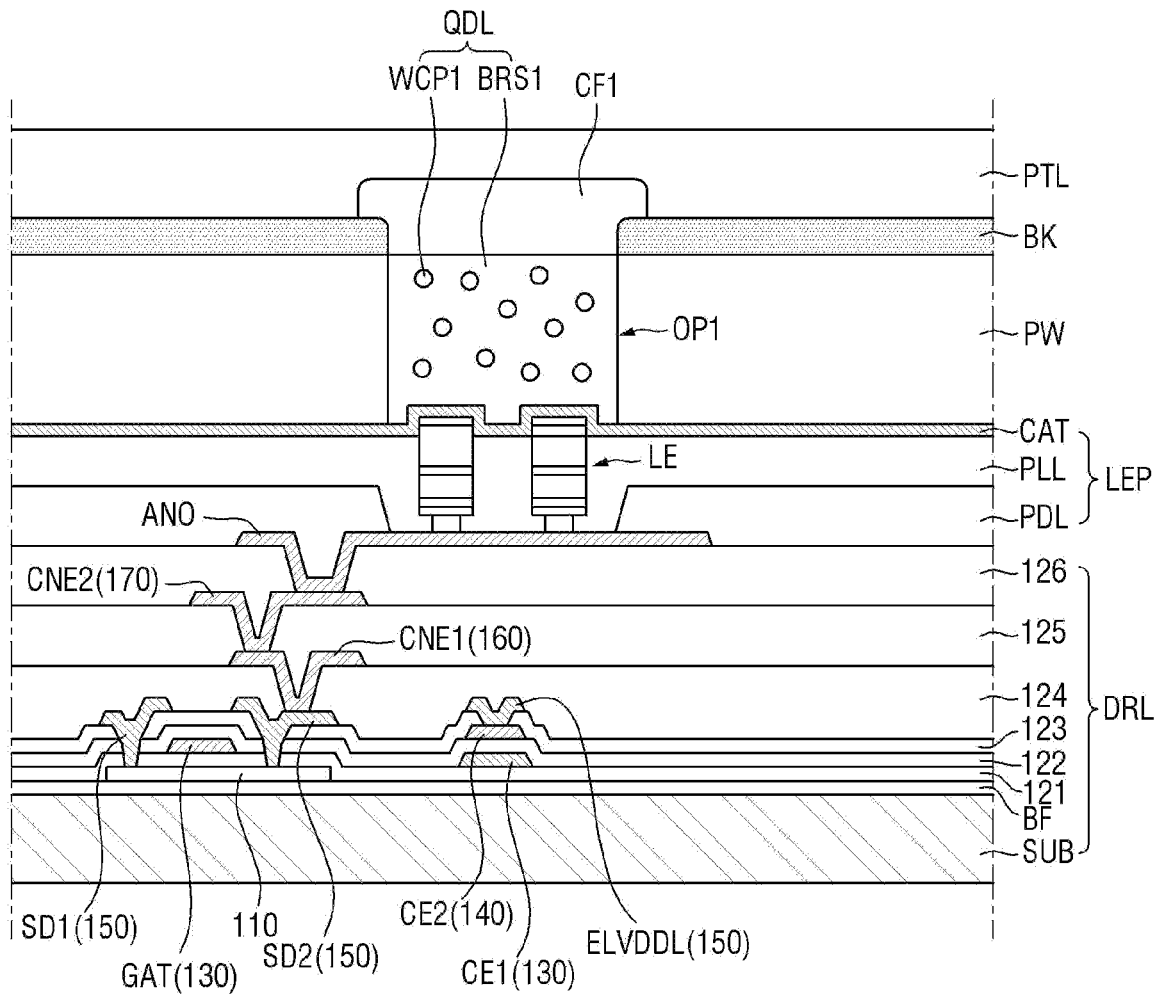
FIG. 5 is a schematic enlarged view illustrating a first emission area according to an embodiment.
Figure 6:
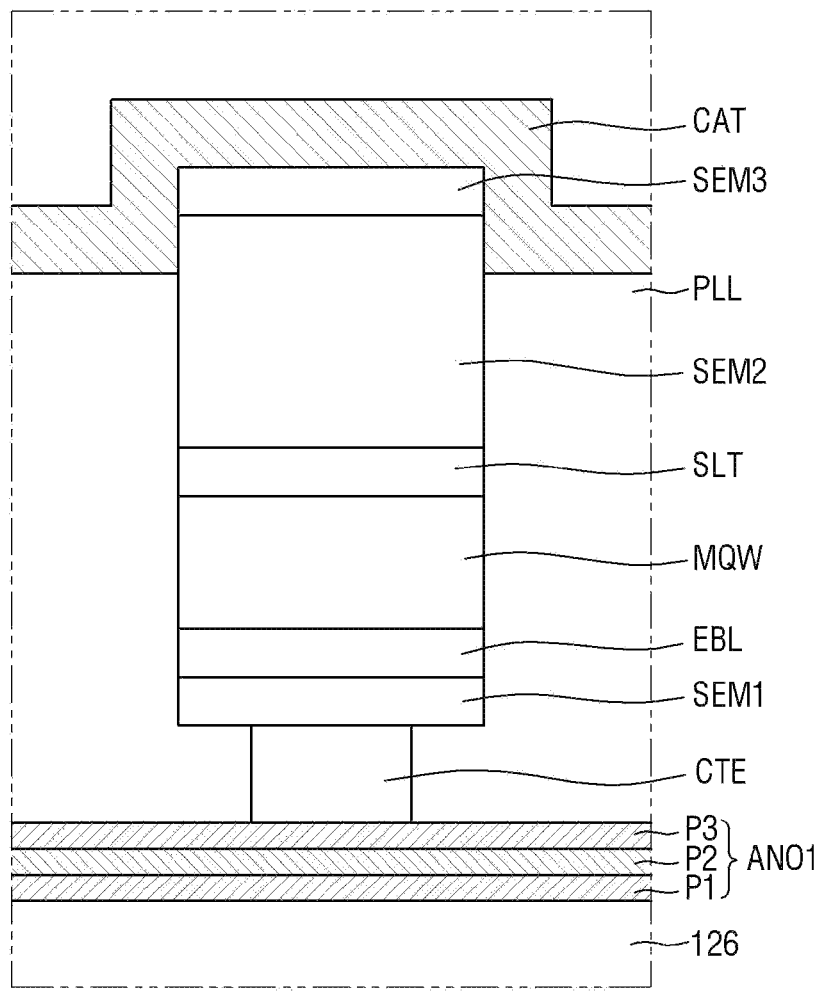
FIG. 6 is a schematic cross-sectional view illustrating a light emitting element according to an embodiment.
Figure 7:
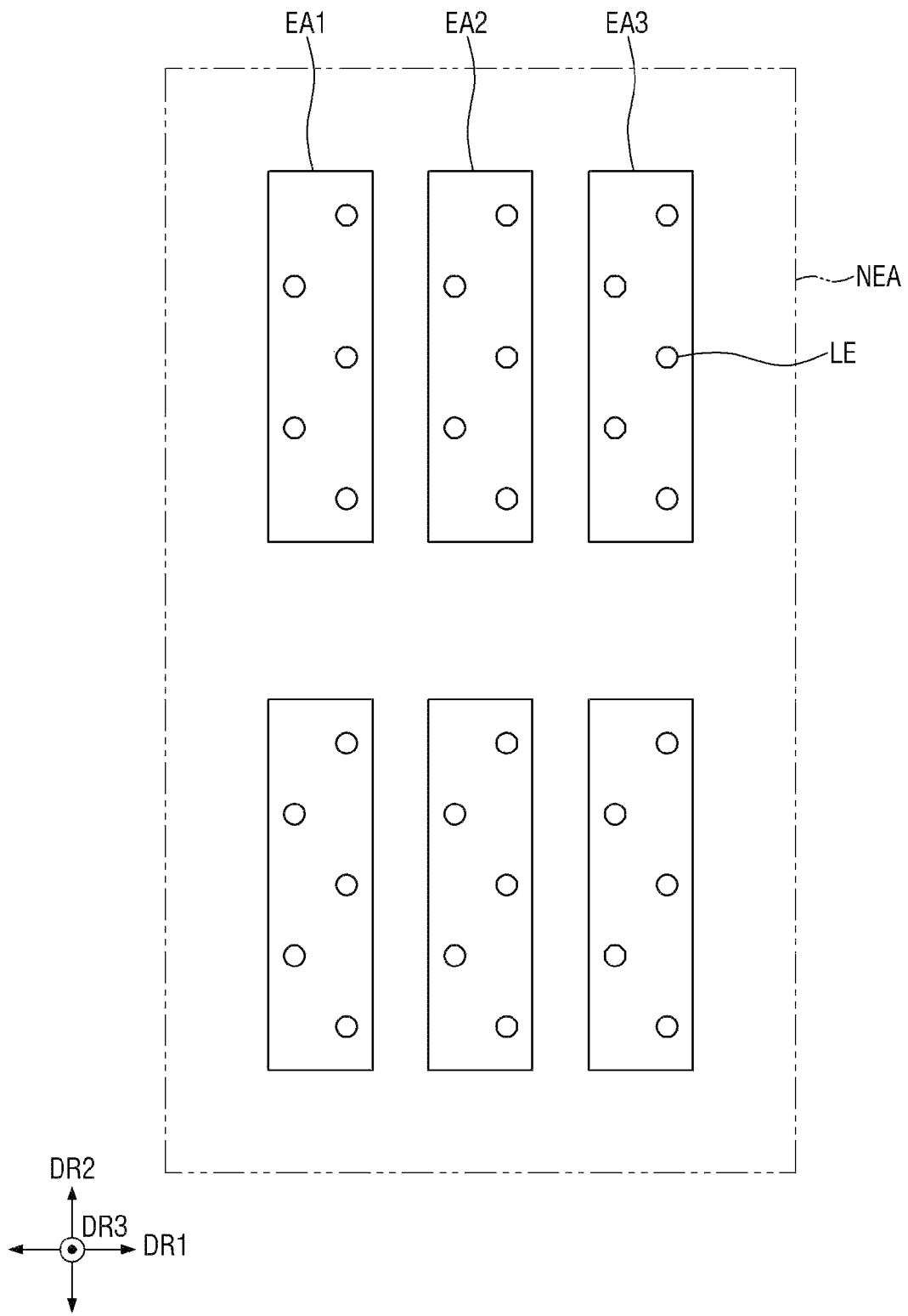
FIG. 7 is a schematic plan view illustrating multiple emission areas according to an embodiment.

FIG. 4 is a schematic cross-sectional view illustrating the display device according to an embodiment. FIG. 5 is a schematic enlarged view illustrating a first emission area according to an embodiment. FIG. 6 is a schematic cross-sectional view illustrating a light emitting element according to an embodiment. FIG. 7 is a schematic plan view illustrating multiple emission areas according to an embodiment.

Referring to FIGS. 4 to 7, the display device 10 may include a display substrate 100 and a wavelength conversion part 200 disposed on the display substrate 100. The display substrate 100 may include a circuit driving part DRL and a light emitting element part LEP disposed on the circuit driving part DRL.

The circuit driving part DRL may include a substrate SUB, a buffer layer BF, a semiconductor layer 110, a first insulating layer (first inorganic insulating layer) 121, a first conductive layer 130, a second insulating layer (second inorganic insulating layer) 122, a second conductive layer 140, a third insulating layer (third inorganic insulating layer) 123, a third conductive layer 150, a fourth insulating layer (first organic insulating layer) 124, a fourth conductive layer 160, a fifth insulating layer (second organic insulating layer) 125, a fifth conductive layer 170, and a sixth insulating layer (third organic insulating layer) 126. The light emitting element part LEP may include a pixel electrode ANO, a pixel defining film PDL, a light emitting element LE, and a common electrode CAT. The respective layers may be sequentially stacked on each other in the order described above. Each layer may be formed as a single film, but may also be formed as a stacked film including multiple films. Another layer may also be further disposed between the respective layers.

The substrate SUB may support the respective layers disposed thereon. In case that the organic light emitting display device is a bottom or double-sided emission-type display device, a transparent substrate may be used as the substrate SUB. In case that the organic light emitting display device is a top emission-type display device, not only a transparent substrate, but also a translucent or opaque substrate may be used as the substrate SUB.

The substrate SUB may be a rigid substrate or be a flexible substrate that may be bent, folded, and rolled. A material constituting the flexible substrate may be, for example, polyimide (PI), but is not limited thereto.

The buffer layer BF may be disposed on the substrate SUB. The buffer layer BF may prevent diffusion of impurity ions, prevent permeation of moisture or outside air, and perform a surface planarization function. The buffer layer BF may include silicon nitride, but is not limited thereto, and may include silicon oxide, silicon oxynitride, or the like, or a combination thereof. The buffer layer BF may be omitted depending on a type, a process condition, or the like, of the substrate SUB.

The semiconductor layer 110 may be disposed on the buffer layer BF. The semiconductor layer 110 may form a channel of a thin film transistor of the pixel. The semiconductor layer 110 may include polycrystalline silicon. However, the disclosure is not limited thereto, and the semiconductor layer 110 may also include single crystal silicon, low-temperature polycrystalline silicon, amorphous silicon, an oxide semiconductor, or a combination thereof. The oxide semiconductor may include at least one of a binary compound (ABx), a ternary compound (ABxCy), and a quaternary compound (ABxCyDz) including, for example, indium, zinc, gallium, tin, titanium, aluminum, hafnium (Hf), zirconium (Zr), magnesium (Mg), and the like.

The first insulating layer 121 may be disposed on the semiconductor layer 110. The first insulating layer 121 may be a first gate insulating film having a gate insulating function. The first insulating layer 121 may include an inorganic insulating material. The first insulating layer 121 may include a silicon compound, a metal oxide, or the like, or a combination thereof. For example, the first insulating layer 121 may include silicon oxide, silicon nitride, silicon oxynitride, aluminum oxide, tantalum oxide, hafnium oxide, zirconium oxide, titanium oxide, or the like, or a combination thereof.

The first conductive layer 130 may be disposed on the first insulating layer 121. The first conductive layer 130 may include a gate electrode GAT of the thin film transistor of the pixel, a scan line connected to the gate electrode GAT, and a first electrode CE1 of the maintaining capacitor CST.

The first conductive layer 130 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 122 may be disposed on the first conductive layer 130. The second insulating layer 122 may be an interlayer insulating film or a second gate insulating film. The second insulating layer 122 may include an inorganic insulating material. The second insulating layer 122 may include a same material as the first insulating layer 121, but is not limited thereto.

The second conductive layer 140 may be disposed on the second insulating layer 122. The second conductive layer 140 may include the second electrode CE2 of the maintaining capacitor CST. The second conductive layer 140 may be formed of a same material as the first conductive layer 130, but is not limited thereto.

The third insulating layer 123 may be disposed on the second conductive layer 140. The third insulating layer 123 may be an interlayer insulating film. The third insulating layer 123 may include an inorganic insulating material. The third insulating layer 123 may include a same material as the first insulating layer 121, but is not limited thereto.

The third conductive layer 150 may be disposed on the third insulating layer 123. The third conductive layer 150 may include a first electrode SD1 and a second electrode SD2 of the thin film transistor of the pixel. The first electrode SD1 and the second electrode SD2 of the thin film transistor may be electrically connected to a source region and a drain region of the semiconductor layer 110 through contact holes penetrating through the third insulating layer 123, the second insulating layer 122, and the first insulating layer 121. The first source voltage line ELVDL of the pixel may also be formed of the third conductive layer 150. The first source voltage line ELVDL may be electrically connected to the second electrode CE2 of the maintaining capacitor CST through a contact hole penetrating through the third insulating layer 123.

The third conductive layer 150 may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 150 may include stacked structures. For example, the third conductive layer 150 may be formed in a stacked structure of Ti/Al/Ti, Mo/Al/Mo, Mo/AlGe/Mo, Ti/Cu, or the like.

The fourth insulating layer 124 may be disposed on the third conductive layer 150. The fourth insulating layer 124 may cover the third conductive layer 150. The fourth insulating layer 124 may be a via layer. The fourth insulating layer 124 may include an organic insulating material. For example, the fourth insulating layer 124 may include a polyacrylates resin, an epoxy resin, a phenolic resin, a polyamides resin, a polyimides resin, an unsaturated polyesters resin, a polyphenyleneethers resin, a polyphenylenesulfides resin, benzocyclobutene (BCB), or the like, or a combination thereof.

The fourth conductive layer 160 may be disposed on the fourth insulating layer 124. The fourth conductive layer 160 may include a first anode connection electrode CNE1. The first anode connection electrode CNE1 may be electrically connected to the second electrode SD2 of the thin film transistor through a contact hole penetrating through the fourth insulating layer 124. The pixel electrode ANO and the second electrode SD2 of the thin film transistor may be electrically connected to each other through the first anode connection electrode CNE1 and a second anode connection electrode CNE2. The fourth conductive layer 160 may include a same material as the third conductive layer 150 or may include a same stacked structure as the third conductive layer 150, but is not limited thereto.

The fifth insulating layer 125 may be disposed on the fourth conductive layer 160. The fifth insulating layer 125 may cover the fourth conductive layer 160. The fifth insulating layer 125 may be a via layer. The fifth insulating layer 125 may include an organic insulating material. The fifth insulating layer 125 may include a same material as the fourth insulating layer 124, but is not limited thereto.

The fifth conductive layer 170 may be disposed on the fifth insulating layer 125. The fifth conductive layer 170 may include the second anode connection electrode CNE2. The fifth conductive layer 170 may further include the second source voltage line ELVSL (see FIG. 3). The second anode connection electrode CNE2 may be electrically connected to the first anode connection electrode CNE1 through a contact hole penetrating through the fifth insulating layer 125. The fifth conductive layer 170 may include a same material as the third conductive layer 150 or may include a same stacked structure as the third conductive layer 150, but is not limited thereto.

The sixth insulating layer 126 may be disposed on the fifth conductive layer 170. The sixth insulating layer 126 may cover the fifth conductive layer 170. The sixth insulating layer 126 may be a via layer. The sixth insulating layer 126 may include an organic insulating material. The sixth insulating layer 126 may include a same material as the fourth insulating layer 124, but is not limited thereto.

The pixel electrode ANO may be disposed on the sixth insulating layer 126. The pixel electrode ANO may be a pixel electrode provided for each pixel. The pixel electrode ANO may be connected to the second anode connection electrode CNE2 through a contact hole penetrating through the sixth insulating layer 126. The pixel electrode ANO may at least partially overlap an emission area EA of the pixel.

The pixel electrode ANO may have a stacked film structure in which a material layer having a high work function, formed of indium tin oxide (ITO), indium zinc oxide (IZO), zinc oxide (ZnO), or indium oxide ($In_2O_3$) and a reflective material layer formed of silver (Ag), magnesium (Mg), aluminum (Al), platinum (Pt), lead (Pd), palladium (Pd), gold (Au), nickel (Ni), neodymium (Nd), iridium (Ir), chromium (Cr), lithium (Li), calcium (Ca), or mixtures thereof may be stacked on each other, but is not limited thereto. The material layer having the high work function may be disposed on a layer above the reflective material layer to be disposed close to the light emitting element EL. The pixel electrode ANO may have a multilayer structure such as ITO/Mg, ITO/MgF, ITO/Ag, ITO/Ag/ITO, or Cu/Ti, but is not limited thereto.

In case that the pixel electrode ANO includes the multilayer structure of Cu/Ti, an adhesive force between the pixel electrode ANO and the light emitting element LE may be improved.

The pixel defining film PDL may be disposed on the pixel electrode ANO. The pixel defining film PDL may include an opening exposing the pixel electrode ANO. Emission areas EA: EA1, EA2, and EA3 and non-emission areas NEM may be divided by the pixel defining film PDL and the openings of the pixel defining film PDL.

The emission areas EA may include a first emission area EA1, a second emission area EA2, and a third emission area EA3 that emit light of different colors. The first emission area EA1 may emit light of a first color, the second emission area EA2 may emit light of a second color different from the first color, and the third emission area EA3 may emit light of a third color different from the first color and the second color. For example, the first color may be blue, the second color may be green, and the third color may be red, but the disclosure is not limited thereto.

The pixel defining film PDL may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). The pixel defining film PDL may also include an inorganic material.

The light emitting element LE may be disposed on the pixel electrode ANO exposed by the pixel defining film PDL. Multiple light emitting elements LE may be disposed on one pixel electrode ANO exposed by the pixel defining film PDL, but the disclosure is not limited thereto.

The light emitting element LE may be disposed in each of the first emission area EA1, the second emission area EA2, and the third emission area EA3. The light emitting element LE may be a vertical light emitting diode element extending to be elongated in the third direction DR3. For example, a length of the light emitting element LE in the third direction DR3 may be greater than a length of the light emitting element LE in a horizontal direction. The length in the horizontal direction refers to a length in the first direction DR1 or a length in the second direction DR2. For example, the length of the light emitting element LE in the third direction DR3 may be approximately 1 to approximately 5 µm.

The light emitting elements LE may be disposed in the plural in each of the first emission area EA1, the second emission area EA2, and the third emission area EA3. In other words, multiple light emitting elements LE may be disposed in each of the first emission area EA1, the second emission area EA2, and the third emission area EA3. However, the disclosure is not limited thereto. It has been illustrated in FIG. 7 that five light emitting elements LE are disposed in one emission area, but the number of light emitting elements LE disposed in one emission area is not limited thereto.

The light emitting elements LE may be generally arranged along the second direction DR2 in each of the first emission area EA1, the second emission area EA2, and the third emission area EA3 in plan view. The light emitting elements LE adjacent to each other in the second direction DR2 in plan view in each emission area may be disposed to be misaligned with each other on the basis of the second direction DR2. In other words, the light emitting elements LE disposed in each emission area may be generally disposed along the second direction DR2 in plan view, but the light emitting elements LE adjacent to each other may be adjacent to each other in a direction inclined with respect to the first direction DR1 and the second direction DR2. However, a layout of the light emitting elements LE in plan view is not limited thereto.

The light emitting element LE may be a micro light emitting diode element. The light emitting element LE may include a connection electrode CTE, a first semiconductor layer SEM1, an electron blocking layer EBL, an active layer MQW, a superlattice layer SLT, a second semiconductor layer SEM2, and a third semiconductor layer SEM3 in the thickness direction of the display substrate 100, that is, the third direction DR3. The connection electrode CTE, the first semiconductor layer SEM1, the electron blocking layer EBL, the active layer MQW, the superlattice layer SLT, the second semiconductor layer SEM2, and the third semiconductor layer SEM3 may be sequentially stacked on each other in the third direction DR3.

The light emitting element LE may have a cylindrical shape, a disk shape, or a rod shape with a width greater than a height. However, the disclosure is not limited thereto, and the light emitting element LE may have a shape such as a rod shape, a wire shape, or a tube shape, or a polygonal prism shape such as a cube shape, a rectangular parallelepiped shape, or a hexagonal prism shape, or may have various shapes such as a shape extending in a direction and having outer surfaces partially inclined.

The connection electrode CTE may be disposed on each of multiple pixel electrodes ANO. Hereinafter, the light emitting element LE disposed on a first pixel electrode ANO1 will be described by way of example.

The connection electrode CTE may be adhered to the first pixel electrode ANO1 to serve to apply a light emitting signal to the light emitting element LE. The connection electrode CTE may be an ohmic connection electrode. However, the disclosure is not limited thereto, and the connection electrode CTE may also be a Schottky connection electrode. The light emitting element LE may include at least one connection electrode CTE. It has been illustrated in FIGS. 5 and 6 that the light emitting element LE includes one connection electrode CTE, but the disclosure is not limited thereto. In some cases, the light emitting element LE may include a larger number of connection electrodes CTE or the connection electrode CTE may be omitted. A description for a light emitting element LE to be provided later may be similarly applied even though the number of the connection electrodes CTE may be changed or the light emitting element LE further includes another structure.

The connection electrode CTE may decrease resistance between the light emitting element LE and the first pixel electrode ANO1 and improve adhesiveness between the light emitting element LE and the first pixel electrode ANO1, in case that the light emitting element LE is electrically connected to the first pixel electrode ANO1 in the display device 10 according to an embodiment. The connection electrode CTE may include a conductive metal oxide. For example, the connection electrode CTE may be formed of ITO. The connection electrode CTE may be in direct contact with and connected to the first pixel electrode ANO1 disposed thereunder, and may thus be formed of a same material as the first pixel electrode ANO1. Accordingly, adhesiveness between the connection electrode CTE and the first pixel electrode ANO1 may be improved, such that contact characteristics between the connection electrode CTE and the first pixel electrode ANO1 may be increased.

The first pixel electrode ANO1 may include a lower electrode layer P1, a reflective layer P2, and an upper electrode layer P3. The lower electrode layer P1 may be disposed at the lowermost portion of the first pixel electrode ANO1 and be electrically connected from a switching element. The lower electrode layer P1 may include a metal oxide, for example, titanium oxide ($TiO_2$), indium tin oxide (ITO), indium zinc oxide (IZO), zinc oxide (ZnO), indium tin zinc oxide (ITZO), magnesium oxide (MgO), or a combination thereof.

The reflective layer P2 may be disposed on the lower electrode layer P1 and reflect light emitted from the light emitting element LE upward. The reflective layer P2 may include a metal having a high reflectivity, for example, silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or mixtures thereof.

The upper electrode layer P3 may be disposed on the reflective layer P2 and be in direct contact with the light emitting element LE. The upper electrode layer P3 may be disposed between the reflective layer P2 and the connection electrode CTE of the light emitting element LE to be in direct contact with the connection electrode CTE. As described above, the connection electrode CTE may be formed of the metal oxide, and the upper electrode layer P3 may also be formed of a metal oxide, similar to the connection electrode CTE. The upper electrode layer P3 may include, for example, titanium oxide ($TiO_2$), indium tin oxide (ITO), indium zinc oxide (IZO), zinc oxide (ZnO), indium tin zinc oxide (ITZO), or magnesium oxide (MgO). In an embodiment, in case that the connection electrode CTE is formed of ITO, the first pixel electrode ANO1 may have a multilayer structure of ITO/Ag/ITO.

The first semiconductor layer SEM1 may be disposed on the connection electrode CTE. The first semiconductor layer SEM1 may be a p-type semiconductor, and may include a semiconductor material having a chemical formula: $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with a p-type dopant. The first semiconductor layer SEM1 may be doped with a p-type dopant, which may be Mg, Zn, Ca, Se, Ba, or the like, or a combination thereof. For example, the first semiconductor layer SEM1 may be formed of p-GaN doped with p-type Mg. A thickness of the first semiconductor layer SEM1 may be in the range of about 30 nm to about 200 nm, but is not limited thereto.

The electron blocking layer EBL may be disposed on the first semiconductor layer SEM1. The electron blocking layer EBL may be a layer for suppressing or preventing too many electrons from flowing into the active layer MQW. For example, the electron blocking layer EBL may be formed of p-AlGaN doped with p-type Mg. A thickness of the electron blocking layer EBL may be in the range of about 10 nm to about 50 nm, but is not limited thereto. The electron blocking layer EBL may be omitted.

The active layer MQW may be disposed on the electron blocking layer EBL. The active layer MQW may emit light by a combination of electron-hole pairs according to electrical signals applied through the first semiconductor layer SEM1 and the second semiconductor layer SEM2. The active layer MQW may emit first light having a central wavelength band in the range of about 450 nm to about 495 nm, that is, light of a blue wavelength band.

The active layer MQW may include a material having a single or multiple quantum well structure. In case that the active layer MQW includes the material having the multiple quantum well structure, the active layer MQW may have a structure in which well layers and barrier layers may be alternately stacked on each other. The well layer may be formed of InGaN, and the barrier layer may be formed of GaN or AlGaN, but the disclosure is not limited thereto. A thickness of the well layer may be approximately 1 to approximately 4 nm, and a thickness of the barrier layer may be approximately 3 nm to approximately 10 nm.

In other embodiments, the active layer MQW may have a structure in which semiconductor materials having large band gap energy and semiconductor materials having small band gap energy may be alternately stacked on each other, and may include other Group III to Group V semiconductor materials depending on a wavelength band of emitted light. The light emitted by the active layer MQW is not limited to the first light, and in some cases, the active layer MQW may emit second light (light of a green wavelength band) or third light (light of a red wavelength band).

The superlattice layer SLT may be disposed on the active layer MQW. The superlattice layer SLT may be a layer for alleviating stress between the second semiconductor layer SEM2 and the active layer MQW. For example, the superlattice layer SLT may be formed of InGaN or GaN. A thickness of the superlattice layer SLT may be approximately 50 to approximately 200 nm. The superlattice layer SLT may be omitted.

The second semiconductor layer SEM2 may be disposed on the superlattice layer SLT. The second semiconductor layer SEM2 may be an n-type semiconductor. The second semiconductor layer SEM2 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The second semiconductor layer SEM2 may be doped with an n-type dopant, which may be Si, Ge, Sn, or the like, or a combination thereof. For example, the second semiconductor layer SEM2 may be formed of n-GaN doped with n-type Si. A thickness of the second semiconductor layer SEM2 may be in the range of about 2 μm to about 4 μm, but is not limited thereto.

The third semiconductor layer SEM3 may be disposed on the second semiconductor layer SEM2. The third semiconductor layer SEM3 may be disposed between the second semiconductor layer SEM2 and the common electrode CAT. The third semiconductor layer SEM3 may be an undoped semiconductor. The third semiconductor layer SEM3 may include a material that may be the same as that of the second semiconductor layer SEM2, but may not be doped with an n-type or p-type dopant. In an embodiment, the third semiconductor layer SEM3 may be formed of at least one of undoped InAlGaN, GaN, AlGaN, InGaN, AlN, and InN, but is not limited thereto.

A planarization layer PLL may be disposed on the pixel defining film PDL and the pixel electrodes ANO. The planarization layer PLL may planarize a step of a lower structure so that a common electrode CAT to be described later may be formed. The planarization layer PLL may be formed to have a height so that at least portions, for example, upper portions of the light emitting elements LE, may protrude above the planarization layer PLL. For example, on the basis of an upper surface of the first pixel electrode ANO1, a height of the planarization layer PLL may be smaller than a height of the light emitting element LE.

The planarization layer PLL may include an organic material so as to planarize the step of the lower structure. For example, the planarization layer PLL may include a polyacrylates resin, an epoxy resin, a phenolic resin, a polyamides resin, a polyimides resin, an unsaturated polyesters resin, a polyphenyleneethers resin, a polyphenylenesulfides resin, benzocyclobutene (BCB), or the like, or a combination thereof.

The common electrode CAT may be disposed on the planarization layer PLL and the light emitting elements LE. Specifically, the common electrode CAT may be disposed on a surface of the substrate SUB on which the light emitting elements LE may be formed, and may be disposed throughout the display area DA and the non-display area NDA. The common electrode CAT may be disposed to overlap each of the emission areas EA1, EA2, and EA3 in the display area DA, and may be formed to have a small thickness so that light may be emitted.

The common electrode CAT may be directly disposed on upper surfaces and side surfaces of the light emitting elements LE. The common electrode CAT may be in direct contact with the second semiconductor layer SEM2 and the third semiconductor layer SEM3 in the side surfaces of the light emitting element LE. As illustrated in FIG. 6, the common electrode CAT may be a common layer covering the light emitting elements LE and disposed to connect the light emitting elements LE to each other in common. Since the second semiconductor layer SEM2 having conductivity has a structure patterned in each of the light emitting elements LE, the common electrode CAT may be in direct contact with side surfaces of the second semiconductor layer SEM2 of each light emitting element LE so that a common voltage may be applied to each light emitting element LE.

Since the common electrode CAT may be entirely disposed on the substrate SUB and the common voltage may be applied to the common electrode CAT, the common electrode CAT may include a material having a low resistance. The common electrode CAT may be formed to have a small thickness so as to transmit light. For example, the common electrode CAT may include a material having a low resistance such as aluminum (Al), silver (Ag), copper (Cu), or a combination thereof. A thickness of the common electrode CAT may be about 10 Å to about 200 Å, but is not limited thereto.

The above-described light emitting elements LE may receive pixel voltages or the anode voltages of the pixel electrodes supplied through the connection electrodes CTE and receive the common voltage supplied through the common electrode CAT. The light emitting element LE may emit light with a luminance according to a voltage difference between the pixel voltage and the common voltage.

The common electrode CAT may be disposed on the light emitting element LE.

The common electrode CAT may be a common electrode entirely disposed without discrimination between pixels. The pixel electrodes ANO, the light emitting elements LE, and the common electrode CAT may constitute organic light emitting elements, respectively.

The common electrode CAT may not only be in contact with the light emitting element LE, but may also be in contact with an upper surface of the pixel defining film PDL. The common electrode CAT may be conformally formed with respect to a lower structure so as to reflect a step of the lower structure.

The common electrode CAT may include a material layer having a small work function, such as Li, Ca, LiF/Ca, LiF/Al, Al, Mg, Ag, Pt, Pd, Ni, Au, Nd, Ir, Cr, BaF, Ba, or compounds or mixtures thereof (e.g., a mixture of Ag and Mg, etc.). The common electrode CAT may further include a transparent metal oxide layer disposed on the material layer having the small work function.

The wavelength conversion part 200 may be disposed on the light emitting element part LEP. The wavelength conversion part 200 may include a partition wall or bank PW, wavelength conversion layers QDL, color filters CF1, CF2, and CF3, a light blocking member BK, and a passivation layer PTL.

The bank PW may be disposed on the common electrode CAT of the display area DPA, and may partition multiple emission areas EA1, EA2, and EA3 together with the pixel defining film. The bank PW may be disposed to extend in the first direction DR1 and the second direction DR2, and may be formed in a lattice pattern throughout the display area DA. The bank PW may not overlap the emission areas EA1, EA2, and EA3, and may overlap the non-emission areas NEA.

The bank PW may include openings OP1, OP2, and OP3 exposing the common electrode CAT disposed thereunder. The openings OP1, OP2, and OP3 may include a first opening OP1 overlapping the first emission area EA1, a second opening OP2 overlapping the second emission area EA2, and a third opening OP3 overlapping the third emission area EA3. Here, the multiple openings OP1, OP2, and OP3 may correspond to the multiple emission areas EA1, EA2, and EA3. For example, the first opening OP1 may correspond to the first emission area EA1, the second opening OP2 may correspond to the second emission area EA2, and the third opening OP3 may correspond to the third emission area EA3.

The bank PW may serve to provide spaces for forming the wavelength conversion layers QDL. To this end, the bank PW may be formed to have a thickness, for example, a thickness in the range of about 1 μm to about 10 μm. The bank PW may include an organic insulating material so as to have a thickness. The organic insulating material may include, for example, an epoxy-based resin, an acrylic resin, a cardo-based resin, or an imide-based resin.

The wavelength conversion layers QDL may be disposed in the openings OP1, OP2, and OP3, respectively. The wavelength conversion layers QDL may convert or shift incident light having a specific peak wavelength to light having another specific peak wavelength and emit the light having another specific peak wavelength. The wavelength conversion layer QDL may convert a portion of the first light of blue emitted from the light emitting element LE into fourth light of yellow. The wavelength conversion layer QDL may mix the first light with the fourth light to emit fifth light of white. The fifth light may be converted into a first light through the first color filter CF1, be converted into the second light through a second color filter CF2, and be converted into the third light through a third color filter CF3.

However, the disclosure is not limited thereto. For example, in case that light of a same color is emitted from the light emitting elements LE disposed in each emission area EA, the wavelength conversion layers QDL disposed in each emission area EA may also convert the light into light of different colors for each emission area EA. In other embodiments, a transmission layer emitting the light emitted from the light emitting element LE without converting the wavelength of the light may be further disposed in the emission area EA.

The wavelength conversion layers QDL may be disposed in the openings OP1, OP2, and OP3, respectively, and be disposed to be spaced apart from each other. The wavelength conversion layers QDL may be formed in a dot-shaped island pattern spaced apart from each other. For example, the wavelength conversion layers QDL may be disposed in the first opening OP1, the second opening OP2, and the third opening OP3, respectively, and may correspond to the first opening OP1, the second opening OP2, and the third opening OP3 in a one-to-one manner. The wavelength conversion layers QDL may be disposed to overlap the first emission area EA1, the second emission area EA2, and the third emission area EA3, respectively. In an embodiment, the wavelength conversion layers QDL may completely overlap the first emission area EA1, the second emission area EA2, and the third emission area EA3, respectively.

The wavelength conversion layer QDL may include a first base resin BRS1 and first wavelength conversion particles WCP1. The first base resin BRS1 may include a light-transmitting organic material. For example, the first base resin BRS1 may include an epoxy-based resin, an acrylic resin, a cardo-based resin, an imide-based resin, or the like, or a combination thereof.

The first wavelength conversion particles WCP1 may convert the first light incident from the light emitting element LE into the fourth light. For example, the first wavelength conversion particles WCP1 may convert light of a blue wavelength band into light of a yellow wavelength band. The first wavelength conversion particle WCP1 may be a quantum dot (QD), a quantum rod, a fluorescent material, or a phosphorescent material. For example, the quantum dot may be a particulate matter emitting a specific color while electrons may be transitioning from a conduction band to a valence band.

The quantum dot may be a semiconductor nanocrystal material. The quantum dot may have a specific bandgap according to its composition and size to absorb light and emit light having a unique wavelength. Examples of semiconductor nanocrystals of the quantum dot may include group IV nanocrystals, group II-VI compound nanocrystals, group III-V compound nanocrystals, group IV-VI compound nanocrystals, or combinations thereof.

The wavelength conversion layer QDL may further include scatterers for scattering the light of the light emitting element LE in a random direction. The scatterer may have a refractive index different from that of the first base resin BRS1 and form an optical interface with the first base resin BRS1. For example, the scatterer may be a light scattering particle. The scatterer is not particularly limited as long as it may be a material capable of scattering at least a portion of transmitted light, but may be, for example, a metal oxide particle or an organic particle. Examples of a metal oxide of the metal oxide particle may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, or a combination thereof, and examples of a material of the organic particle may include an acrylic resin, a urethane resin, or the like, or a combination thereof. The scatterer may scatter light in a random direction regardless of an incident direction of the incident light without substantially converting a wavelength of the light.

In the above-described wavelength conversion part 200, a portion of the first light emitted from the light emitting element LE may be converted into the fourth light by the wavelength conversion layer QDL. The wavelength conversion layer QDL may mix the first light with the fourth light to emit the fifth light of white. Only the first light in the fifth light emitted from the wavelength conversion layer QDL may be transmitted through a first color filter CF1 to be described later, only the second light in the fifth light may be transmitted through a second color filter CF2 to be described later, and only the third light in the fifth light may be transmitted through a third color filter CF3 to be described later. Accordingly, the light emitted from the wavelength conversion part 200 may be blue, red, and green light of the first light, the second light, and the third light, through which a full color may be realized.

Color filters CF1, CF2, and CF3 may be disposed on the bank PW and the wavelength conversion layer QDL. The color filters CF1, CF2, and CF3 may be disposed to overlap the openings OP1, OP2, OP3 and the wavelength conversion layers QDL, respectively. The color filters CF1, CF2, and CF3 may include a first color filter CF1, a second color filter CF2, and a third color filter CF3.

The first color filter CF1 may be disposed to overlap the first emission area EA1. The first color filter CF1 may be disposed on the first opening OP1 of the bank PW so as to overlap the first opening OP1. The first color filter CF1 may transmit the first light emitted from the light emitting element LE and absorb or block the second light and the third light. For example, the first color filter CF1 may transmit light of a blue wavelength band and absorb or block light of other wavelength bands such as green and red wavelength bands.

The second color filter CF2 may be disposed to overlap the second emission area EA2. The second color filter CF2 may be disposed on the second opening OP2 of the bank PW so as to overlap the second opening OP2. The second color filter CF2 may transmit the second light and absorb or block the first light and the third light. For example, the second color filter CF2 may transmit light of a green wavelength band and absorb or block light of other wavelength bands such as blue and red wavelength bands.

The third color filter CF3 may be disposed to overlap the third emission area EA3. The third color filter CF3 may be disposed on the third opening OP3 of the bank PW so as to overlap the third opening OP3. The third color filter CF3 may transmit the third light and absorb or block the first light and the second light. For example, the third color filter CF3 may transmit light of a red wavelength band and absorb or block light of other wavelength bands such as blue and green wavelength bands.

The light blocking member BK may be disposed on the bank PW. The light blocking member BK may overlap the non-emission areas NEA to block transmission of the light. The light blocking member BK may be disposed in an approximately lattice shape in plan view, similar to the pixel defining film PDL or the bank PW. The light blocking member BK may be disposed to overlap the pixel defining film PDL, the planarization layer PLL, and the bank PW, and may not overlap the emission areas EA1, EA2, and EA3.

In an embodiment, the light blocking member BK may include an organic light blocking material, and may be formed by a coating process, an exposing process, and the like, of the organic light blocking material. The light blocking member BK may include a dye or a pigment having light blocking properties, and may be a black matrix. At least portions of the light blocking member BK may overlap the color filters CF1, CF2, and CF3 adjacent thereto, and the color filters CF1, CF2 and CF3 may be disposed on at least portions of the light blocking member BK.

External light incident from the outside of the display device 10 may cause a problem of distorting a color gamut of the wavelength conversion part 200. In case that the light blocking member BK is disposed in the wavelength conversion part 200 according to an embodiment, at least a portion of the external light may be absorbed by the light blocking member BK. Accordingly, distortion of a color due to external light reflection may be reduced. The light blocking member BK may prevent color mixing due to permeation of the light between adjacent emission areas, and accordingly, may further improve a color gamut.

The passivation layer PTL may be disposed on the color filters CF1, CF2, and CF3 and the light blocking member BK. The passivation layer PTL may be disposed at the uppermost portion of the display device 10 to protect the color filters CF1, CF2, CF3 and the light blocking member BK thereunder. A surface, for example, a lower surface of the passivation layer PTL may be in contact with each of upper surfaces of the color filters CF1, CF2, CF3 and the light blocking member BK.

The passivation layer PTL may include an inorganic insulating material in order to protect the color filters CF1, CF2, and CF3 and the light blocking member BK. For example, the passivation layer PTL may include silicon oxide (SiOx), silicon nitride (SiNx), silicon oxynitride (SiOxNy), aluminum oxide (AlxOy), aluminum nitride (AlN), or the like, or a combination thereof, but is not limited thereto. The passivation layer PTL may be formed to have a thickness, for example, a thickness in the range of about 0.01 to about 1 µm. However, the disclosure is not limited thereto.

Figure 8:
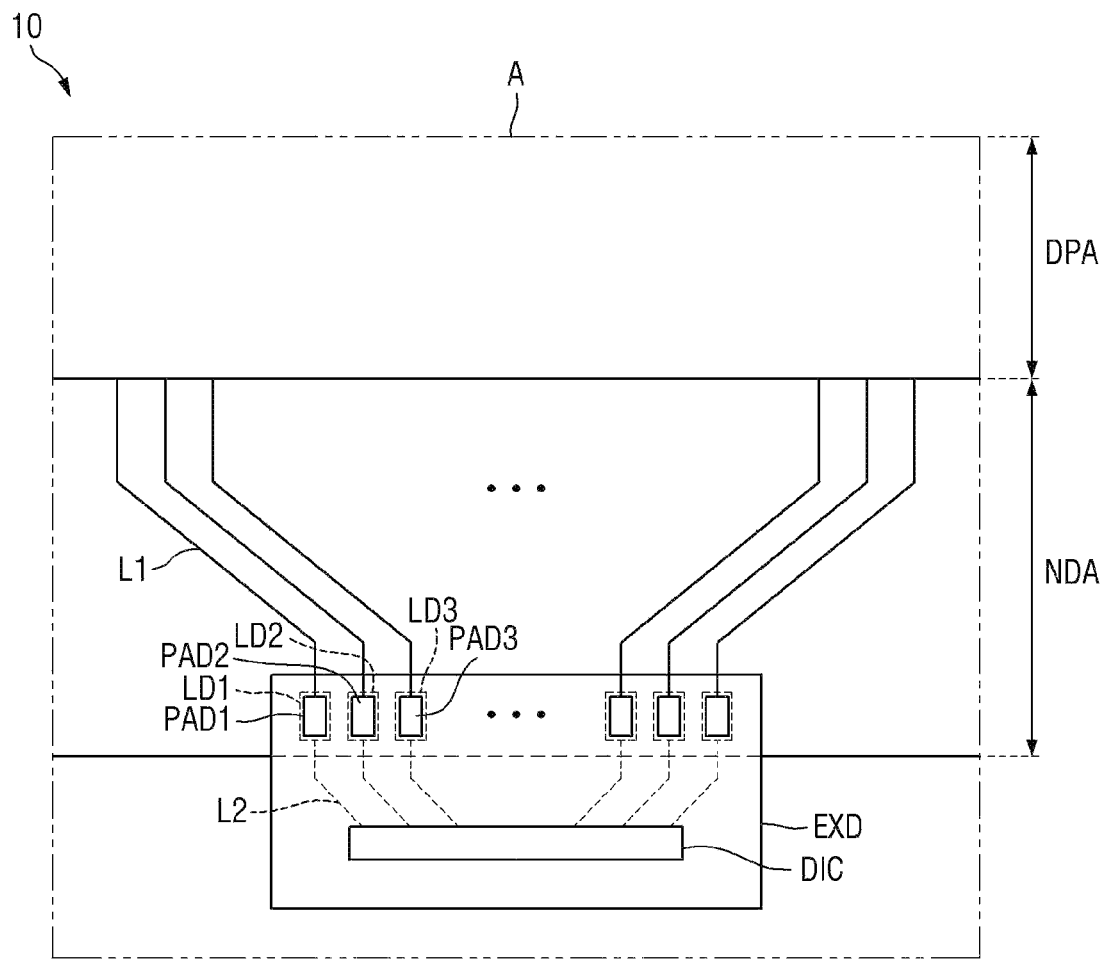
FIG. 8 is an enlarged schematic view of area A of FIG. 1.
Figure 8:
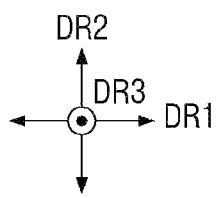
Figure 9:
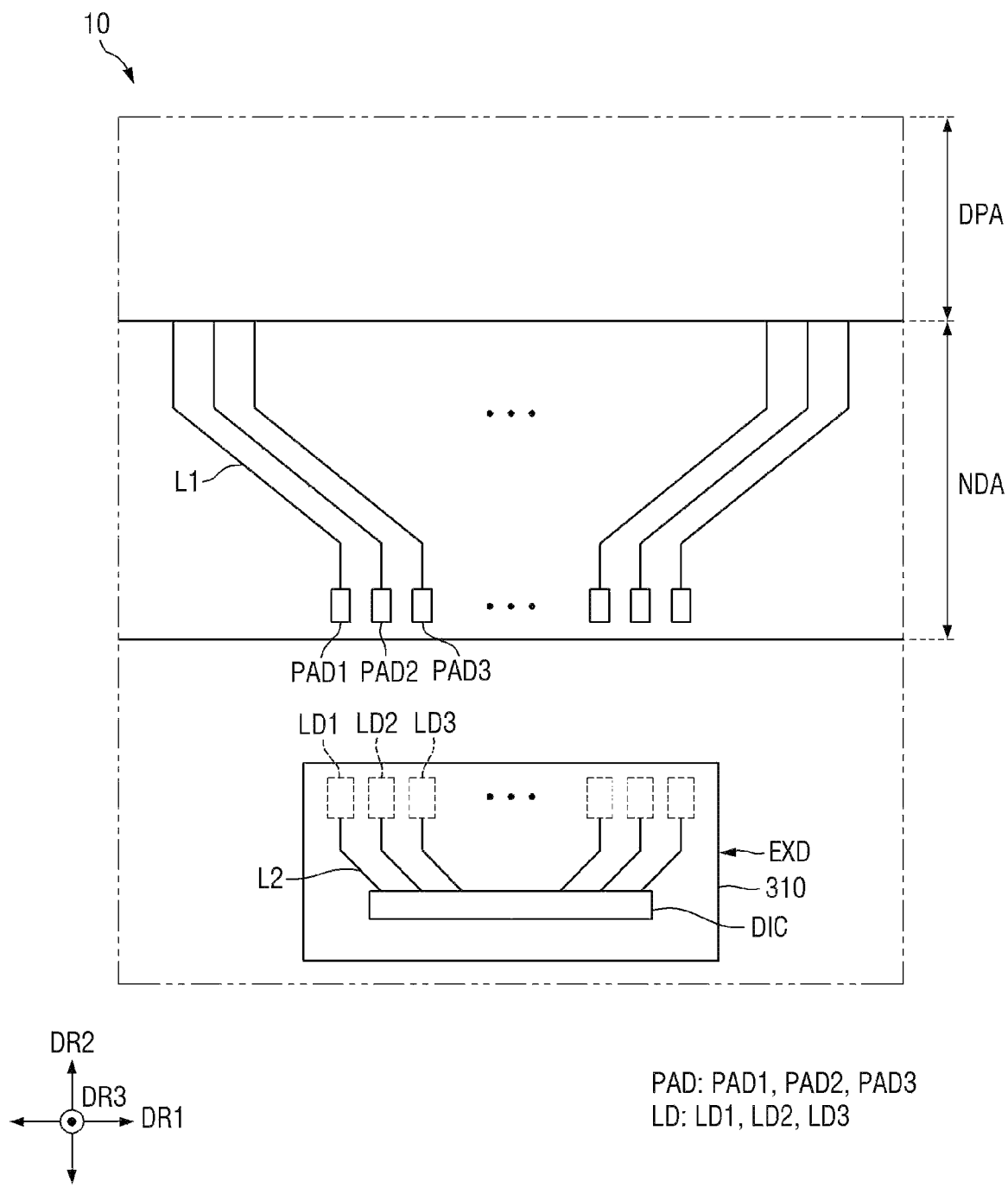
FIG. 9 is a schematic view illustrating a form in which a circuit board of FIG. 8 is separated.
Figure 10:
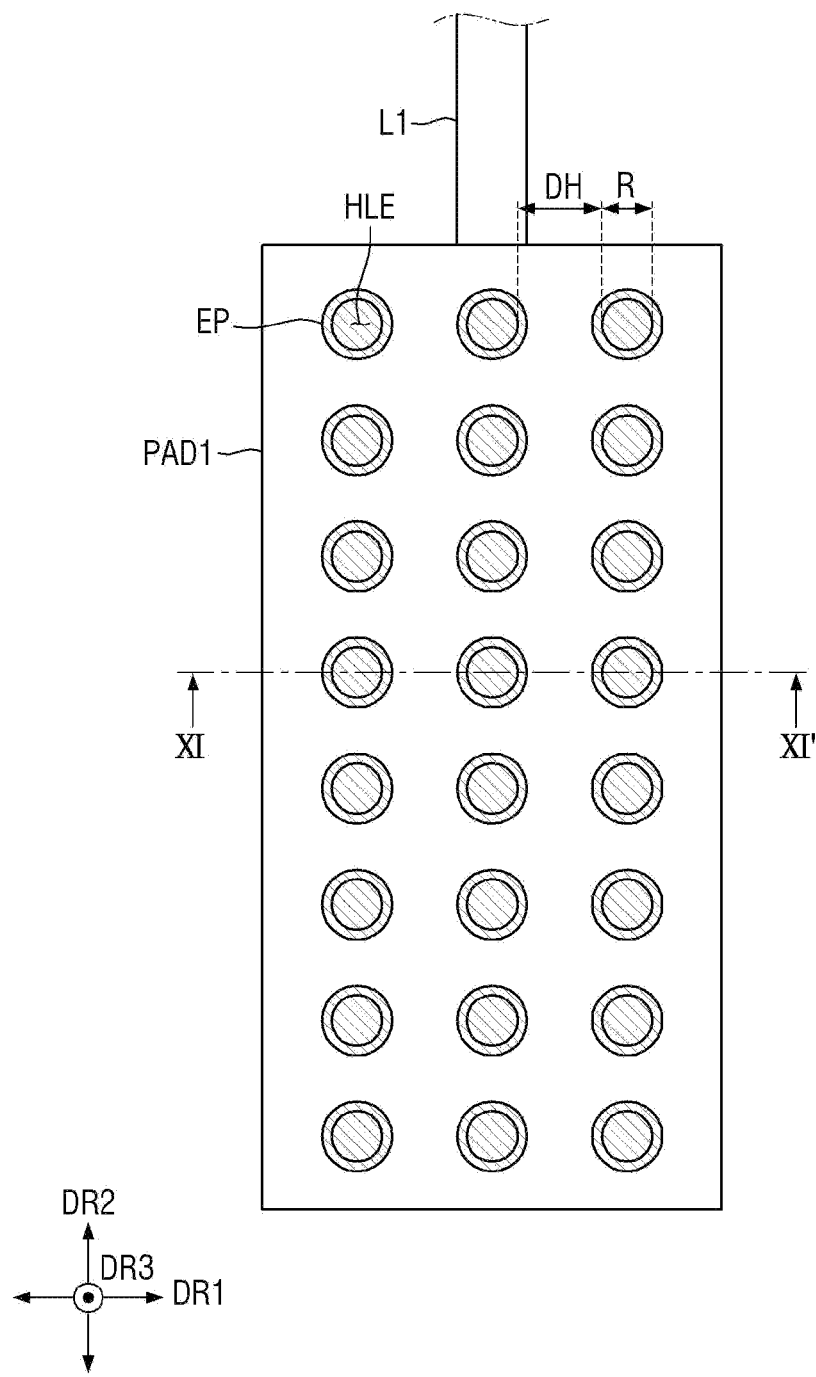
FIG. 10 is an enlarged schematic view of a display pad according to an embodiment.
Figure 11:
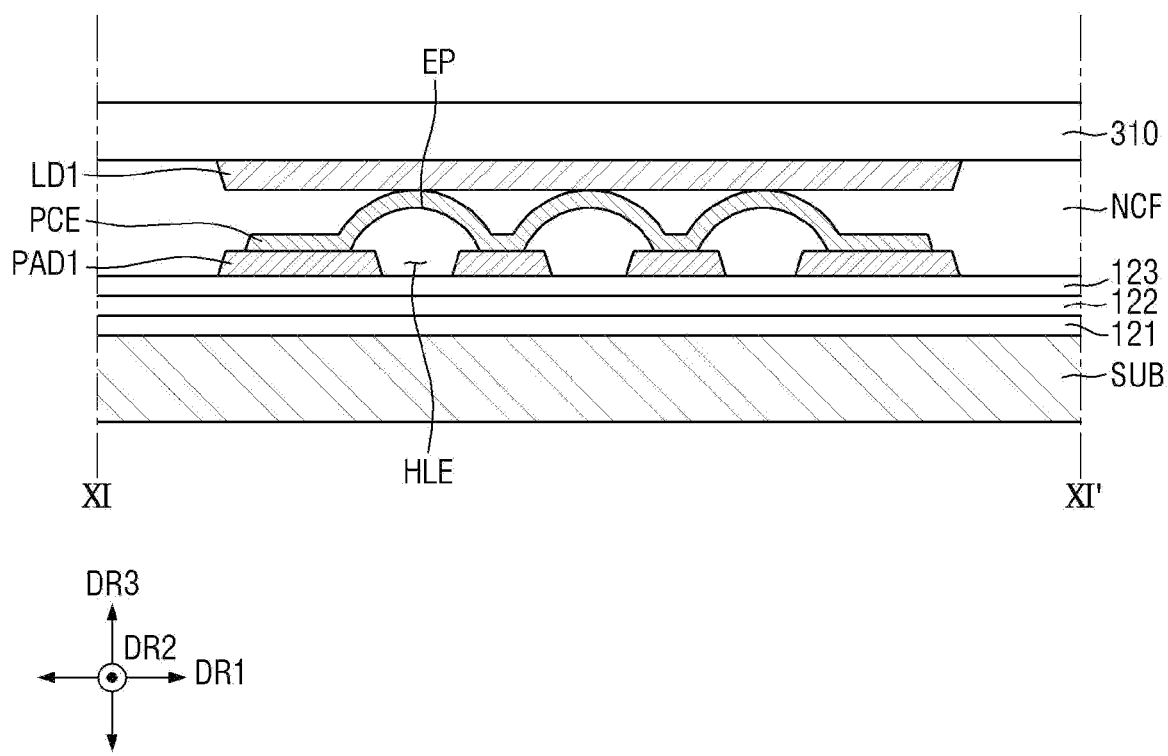
FIG. 11 is a schematic cross-sectional view taken along line XI-XI' of FIG. 10.

FIG. 8 is an enlarged schematic view of area A of FIG. 1. FIG. 9 is a schematic view illustrating a form in which an external device of FIG. 8 is separated. FIG. 10 is an enlarged schematic view of a display pad according to an embodiment. FIG. 11 is a schematic cross-sectional view taken along line XI-XI' of FIG. 10. FIG. 10 illustrates an enlarged view of a first display pad PAD1, but contents to be described below may be similarly applied to a second display pad PAD2 and a third display pad PAD3. FIG. 11 illustrates not only the display pad PAD but also the external device EXD.

Referring to FIGS. 8 to 11, the display device 10 may further include a display pad PAD: PAD1, PAD2, and PAD3 and first signal wirings L1.

The display pad PAD may be disposed at the other end of the display device 10 in the second direction DR2. However, the disclosure is not limited thereto, and the display pads PAD may be also disposed at one end and the other end of the display device 10 in the second direction DR2. The display pad PAD may be disposed on the substrate SUB. At least one insulating layer may be disposed between the display pad PAD and the substrate SUB, but the disclosure is not limited thereto.

Multiple display pads PAD may be provided. The display pad PAD may include a first display pad PAD1, a second display pad PAD2, and a third display pad PAD3. The first to third display pads PAD1, PAD2, and PAD3 may be alternately and repeatedly disposed along the first direction DR1. Each of the first to third display pads PAD1, PAD2, and PAD3 may include, for example, a display signal wiring pad, a touch signal wiring pad, a source voltage pad, a data pad, and a panel dummy pad. A width of the display pad PAD (width of the display pad PAD in the first direction DR1) may be greater than a width of the first signal wiring L1 (width of the first signal wiring L1 in a direction perpendicular to an extending direction), but is not limited thereto.

The first display pad PAD1, the second display pad PAD2, and the third display pad PAD3 may be formed of different conductive layers. For example, the first display pad PAD1 may be formed of the third conductive layer 150, the second display pad PAD2 may be formed of the fourth conductive layer 160, and the third display pad PAD3 may be formed of the fifth conductive layer 170, but the disclosure is not limited thereto. The first to third display pads PAD1, PAD2, and PAD3 may be disposed on the third insulating layer 123, but are not limited thereto.

At least one through hole HLE may penetrate through the display pad PAD in the thickness direction (third direction DR3). In case that multiple through holes HLE are provided, the through holes HLE may be repeatedly disposed along the first direction DR1 and the second direction DR2. The through hole HLE may expose the third insulating layer 123 on which the display pad PAD may be disposed. The through hole HLE may have a circular shape in plan view, but is not limited thereto.

A distance DH between the through holes HLE adjacent to each other may be smaller than about 5 µm or be smaller than about 10 µm, but is not limited thereto. A diameter R of the through hole HLE may be in the range of about 1 µm to about 7 µm or be in the range of about 2 µm to about 4 µm, but is not limited thereto.

The display device 10 may further include a protrusion pattern EP filling the inside of the through hole HLE, a pad connection electrode PCE, and a non-conductive adhesive layer NCF.

The protrusion pattern EP may fill the inside of the through hole HLE and protrude above the display pad PAD. The protrusion pattern EP protruding above the display pad PAD may be disposed on an upper surface of the display pad PAD around the through hole HLE, and may overlap the display pad PAD in the thickness direction (third direction DR3). An outer surface of the protrusion pattern EP may surround the through hole HLE in plan view, but is not limited thereto. The protrusion pattern EP protruding from a portion filling the through hole HLE may have an upwardly convex shape in cross section.

Multiple protrusion patterns EP may be provided, and may be separated from each other and spaced apart from each other, respectively. Each of the protrusion patterns EP may be disposed for each through hole HLE. For example, one protrusion pattern EP may fill the inside of one through hole HLE and protrude above the display pad PAD.

The protrusion pattern EP may include an organic material. The organic material may be substantially the same as the organic material included in any one of the fourth to sixth insulating layers 124, 125, and 126, but is not limited thereto.

The protrusion pattern EP may have elasticity. Accordingly, the protrusion pattern EP may absorb an impact or stress applied from the outside.

At least a portion of the protrusion pattern EP may be disposed in the through hole HLE, such that a defect such as a lift of the protrusion pattern EP may be suppressed and prevented. In other words, at least a portion of the protrusion pattern EP may be disposed in the through hole HLE, such that the protrusion pattern EP may be in contact with the display pad PAD in a larger area, and thus, friction between the protrusion pattern EP and the display pad PAD may increase. Accordingly, the lifting defect of the protrusion pattern EP may be suppressed or prevented.

At least a portion of the protrusion pattern EP may be disposed in the through hole HLE, such that a defect such as a crack of the pad connection electrode PCE may be suppressed or prevented. In other words, a connection lead LD may be compressed toward the display pad PAD, and stress due to the compression may be transferred to the protrusion pattern EP. In case that the protrusion pattern EP fills the inside of the through hole HLE, a thickness of the protrusion pattern EP in the thickness direction (third direction DR3) may increase, and stress applied to the protrusion pattern EP in a vertical direction (e.g., the thickness direction (third direction DR3)) may be more smoothly alleviated. Accordingly, the stress applied to the protrusion pattern EP in the horizontal direction (e.g., the first direction DR1 or the second direction DR2) may be alleviated together. Accordingly, deformation of the protrusion pattern EP may be suppressed or prevented, and a crack or the like of the pad connection electrode PCE disposed on the protrusion pattern EP may be suppressed or prevented, such that reliability of the display device may be improved.

The pad connection electrode PCE may be disposed on the protrusion pattern EP. The pad connection electrode PCE may be generally disposed over an entire area of the display pad PAD. The pad connection electrode PCE may not only be disposed on the protrusion pattern EP, but may also be disposed on the display pad PAD in an area where the protrusion pattern EP may not be disposed. In a portion where the protrusion pattern EP may not be disposed, the pad connection electrode PCE may be physically and/or electrically connected to the display pad PAD. In a portion where the protrusion pattern EP may not be disposed, the pad connection electrode PCE may be in direct contact with the display pad PAD, but is not limited thereto. The pad connection electrode PCE may include a conductive metal, but is not limited thereto.

The connection lead LD may be disposed on the pad connection electrode PCE. The pad connection electrode PCE and the connection lead LD may be in direct contact with and physically and/or electrically connected to each other. The pad connection electrode PCE may electrically connect the display pad PAD and the connection lead LD to each other. For example, the display pad PAD and the connection lead LD may be electrically connected to each other through the pad connection electrode PCE.

The non-conductive adhesive layer NCF may fill a space between the display pad PAD and the connection lead LD. The non-conductive adhesive layer NCF may be disposed between the display pad PAD and the connection lead LD and between the pad connection electrode PCE and the connection lead LD. The non-conductive adhesive layer NCF may be disposed between the third insulating layer 123 and an external device substrate 310 to fill a space between the third insulating layer 123 and the external device substrate 310.

The non-conductive adhesive layer NCF may serve as an adhesive layer. For example, the external device EXD (see FIG. 1) may be attached to the pad part of the display device 10 (see FIG. 1) through the non-conductive adhesive layer NCF. In case that the non-conductive adhesive layer (NCF) is used as an adhesive, an ultrasonic bonding method may be applied, but the disclosure is not limited thereto.

The first signal wirings L1 may electrically connect each pixel of the display area DPA and the display pad PAD to each other. For example, each pixel of the display area DPA and each display pad PAD may be electrically connected to each other through the first signal wirings L1. Each display pad PAD may be electrically connected to the light emitting element LE (see FIG. 4) disposed in each emission area EA (see FIG. 4). For example, the first display pad PAD1 may be electrically connected to the light emitting element LE (see FIG. 4) disposed in the first emission area EA1 (see FIG. 4), the second display pad PAD2 may be electrically connected to the light emitting element LE (see FIG. 4) disposed in the second emission area EA2 (see FIG. 4), and the third display pad PAD3 may be electrically connected to the light emitting element LE (see FIG. 4) disposed in the third emission area EA3 (see FIG. 4), but the disclosure is not limited thereto.

The first signal wiring L1 may extend from the display pad PAD to a side in the second direction DR2, and may extend up to each pixel. Each of the first signal wirings L1 may be formed of a conductive layer different from that of the remaining areas in at least a partial area thereof, but is not limited thereto.

The external device EXD may further include the external device substrate 310, the connection lead LD, and second signal wirings L2. The external device substrate 310 may provide a space in which the connection lead LD and the second signal wirings L2 may be disposed. The connection lead LD and the second signal wirings L2 may be disposed on the external device substrate 310. The connection lead LD and the second signal wirings L2 may be disposed on a rear surface of the external device substrate 310. Here, the rear surface may refer to a surface in an opposite direction to an emission direction in case that the display device 10 emits light from a front surface (top surface) thereof.

The connection lead LD may be disposed at one end of the external device substrate 310 in the second direction DR2. Multiple connection leads LD may be provided. The connection lead LD may include a first connection lead LD1, a second connection lead LD2, and a third connection lead LD3. The first to third connection leads LD1, LD2, and LD3 may be repeatedly disposed along the first direction DR1.

The first to third connection leads LD1, LD2, and LD3 may be alternately and repeatedly disposed along the first direction DR1. Each connection lead LD may correspond to each of the display pads PAD. Each connection lead LD may face each of the display pads PAD and overlap each of the display pads PAD. For example, the first connection lead LD1 may correspond to and overlap the first display pad PAD1, the second connection lead LD2 may correspond to and overlap the second display pad PAD2, and the third connection lead LD3 may correspond to and overlap the third display pad PAD3.

The second signal wirings L2 may be physically and/or electrically connected to the connection lead LD and the driving chip DIC, and may extend from the connection lead LD to the other side in the second direction DR2. In other words, the connection lead LD and the driving chip DIC may be electrically connected to each other through the second signal wirings L2.

Although not illustrated, the driving chip DIC may be electrically connected to a main processor controlling driving (e.g., all driving) of the display device 10. The main processor may be disposed on the external device EXD, but is not limited thereto, and may also be disposed on a separate component. The separate component may be disposed on the external device EXD and electrically connected to the driving chip DIC.

Hereinafter, other embodiments will be described. In the following embodiments, a description for the same or similar configurations as those of the embodiment described above will be omitted or simplified, and configurations different from those of the embodiment described above will be described.

Figure 12:
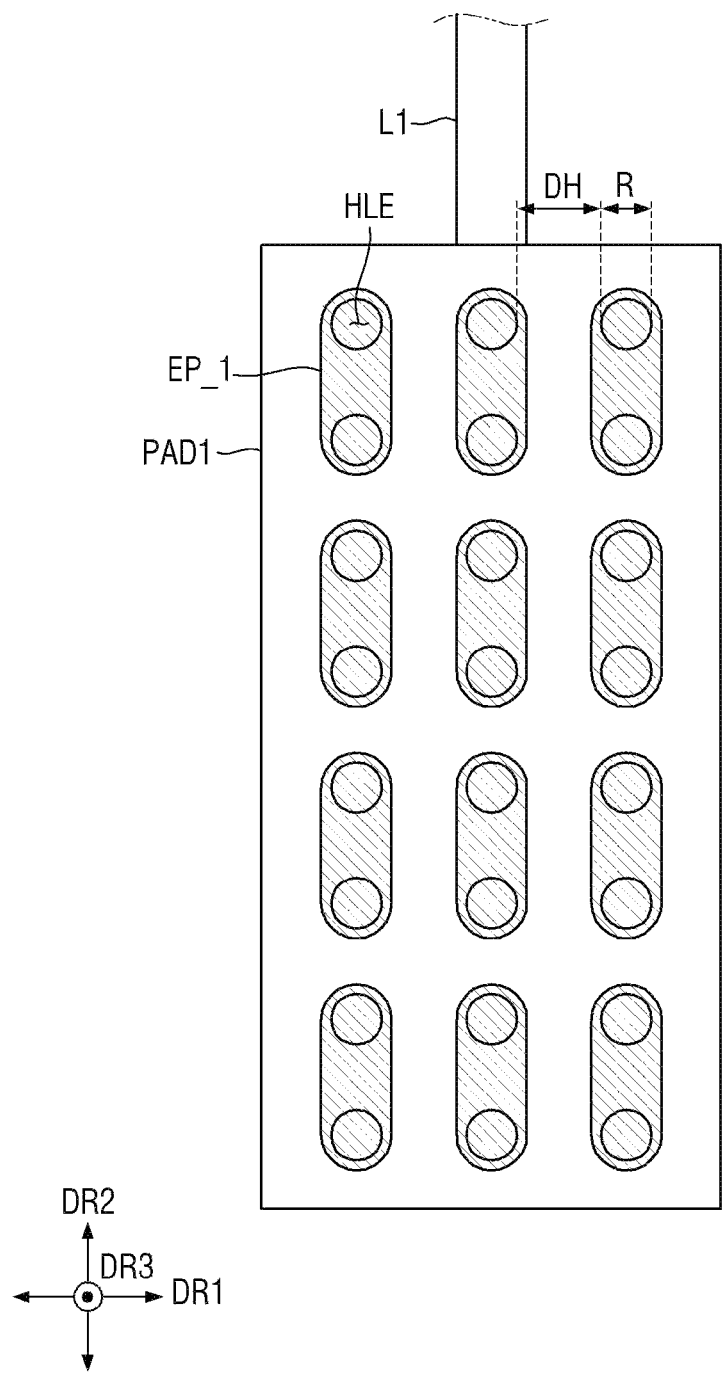
FIG. 12 is a schematic plan view of a display pad according to another embodiment.

FIG. 12 is a schematic plan view of a display pad according to another embodiment.

Referring to FIG. 12, an embodiment may be different from an embodiment of FIG. 10 at least in that each of protrusion patterns EP_1 may be disposed across multiple through holes HLE. In other words, multiple protrusion patterns EP_1 may be provided, and one protrusion pattern EP_1 may fill two through holes HLE adjacent to each other. One protrusion pattern EP_1 may be disposed over the two through holes HLE adjacent to each other. In FIG. 12, one protrusion pattern EP_1 fills through holes HLE adjacent to each other in the second direction DR2, but the disclosure is not limited thereto, and at least some of the protrusion patterns EP_1 may also fill through holes HLE adjacent to each other in the first direction DR1.

A case in which the protrusion pattern EP1 may be disposed over the two through holes HLE has been illustrated in FIG. 12, but the disclosure is not limited thereto, and one protrusion pattern EP1 may also be disposed over three or more through holes HLE.

Also, a defect such as a lift of the protrusion pattern EP_1 may be suppressed or prevented, and a crack or the like of the pad connection electrode PCE (see FIG. 11) disposed on the protrusion pattern EP_1 may be suppressed or prevented, such that reliability of the display device may be improved. The protrusion patterns EP1 may be variously designed, such that a design capable of alleviating stress applied to the protrusion patterns EP_1 as much as possible may be possible.

Figure 13:
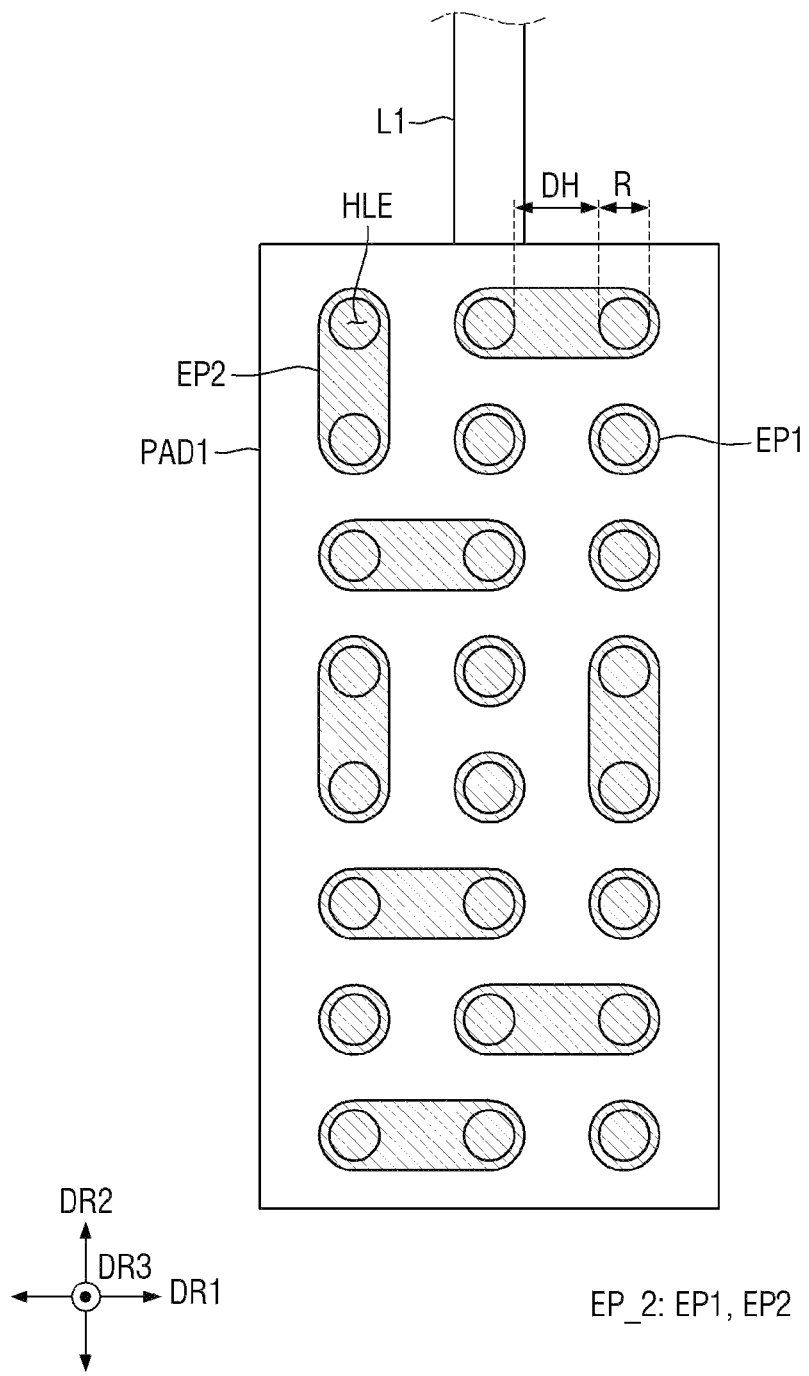
FIG. 13 is a schematic plan view of a display pad according to still another embodiment.

FIG. 13 is a schematic plan view of a display pad according to still another embodiment.

Referring to FIG. 13, an embodiment may be different from an embodiment of FIG. 10 at least in that a protrusion pattern EP_2 may include a first protrusion pattern EP1 disposed in one through hole HLE and a second protrusion pattern EP2 disposed over multiple through holes HLE. The first protrusion pattern EP1 may be substantially the same as the protrusion pattern EP of FIG. 10, and the second protrusion pattern EP2 may be substantially the same as the protrusion pattern EP_1 of FIG. 12. Multiple first protrusion patterns EP1 and multiple second protrusion patterns EP2 may be provided, but the disclosure is not limited thereto.

Also, a defect such as a lift of the protrusion pattern EP_2 may be suppressed or prevented, and a crack or the like of the pad connection electrode PCE (see FIG. 11) disposed on the protrusion pattern EP_2 may be suppressed or prevented, such that reliability of the display device may be improved. The protrusion patterns EP_2 may be variously designed, such that a design capable of alleviating stress applied to the protrusion patterns EP_2 as much as possible may be possible.

Figure 14:
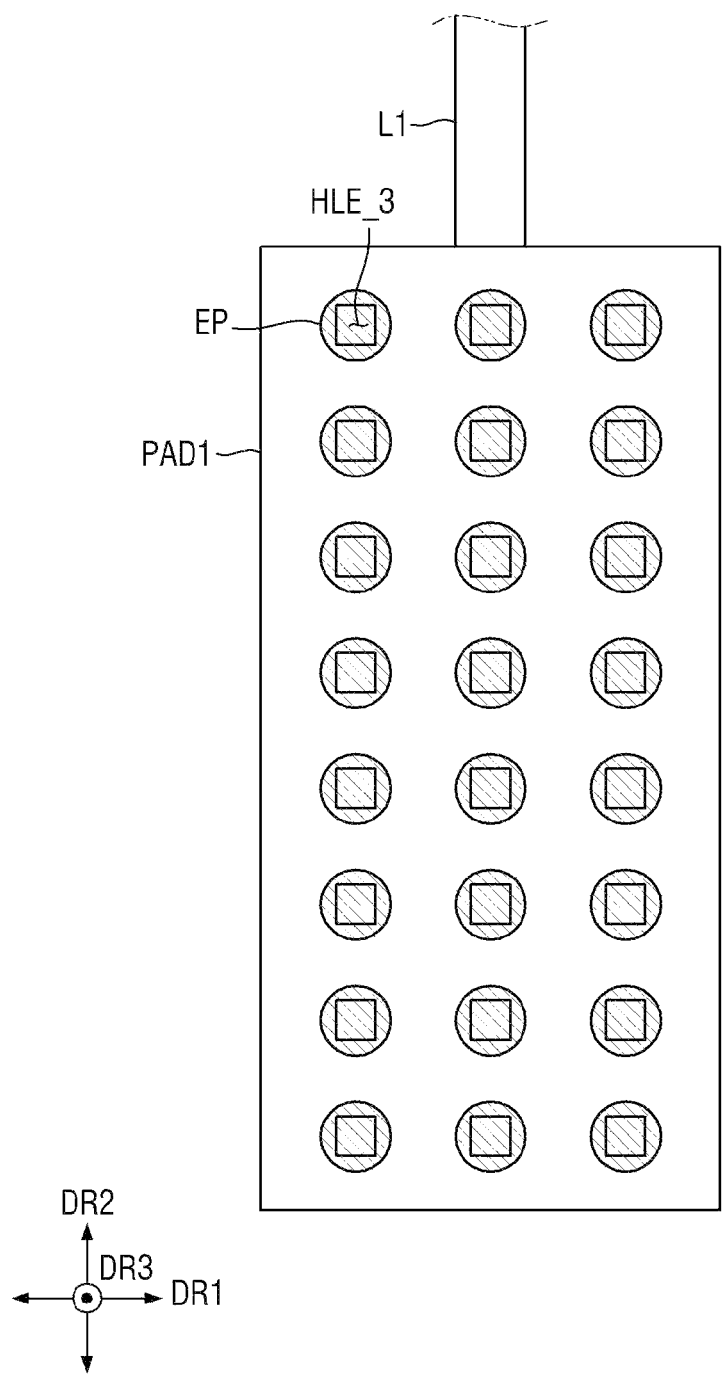
FIG. 14 is a schematic plan view of a display pad according to still another embodiment.

FIG. 14 is a schematic plan view of a display pad according to still another embodiment.

Referring to FIG. 14, an embodiment may be different from an embodiment of FIG. 10 at least in that each of through holes HLE_3 defined by the first display pad PAD1 may have a rectangular shape in plan view. However, the disclosure is not limited thereto, and the through hole HLE_3 may also have a polygonal shape such as a triangular shape, a pentagonal shape, or a hexagonal shape, in plan view.

The first display pad PAD1 has been described in FIG. 14, but a description for the first display pad PAD1 may also be applied to the second display pad PAD2 (see FIG. 8) and the third display pad PAD3 (see FIG. 8).

Also, a defect such as a lift of the protrusion pattern EP may be suppressed or prevented, and a crack or the like of the pad connection electrode PCE (see FIG. 11) disposed on the protrusion pattern EP may be suppressed or prevented, such that reliability of the display device may be improved. The through holes HLE_3 may be variously designed, such that a design capable of alleviating stress applied to the protrusion patterns EP as much as possible may be possible.

Figure 15:
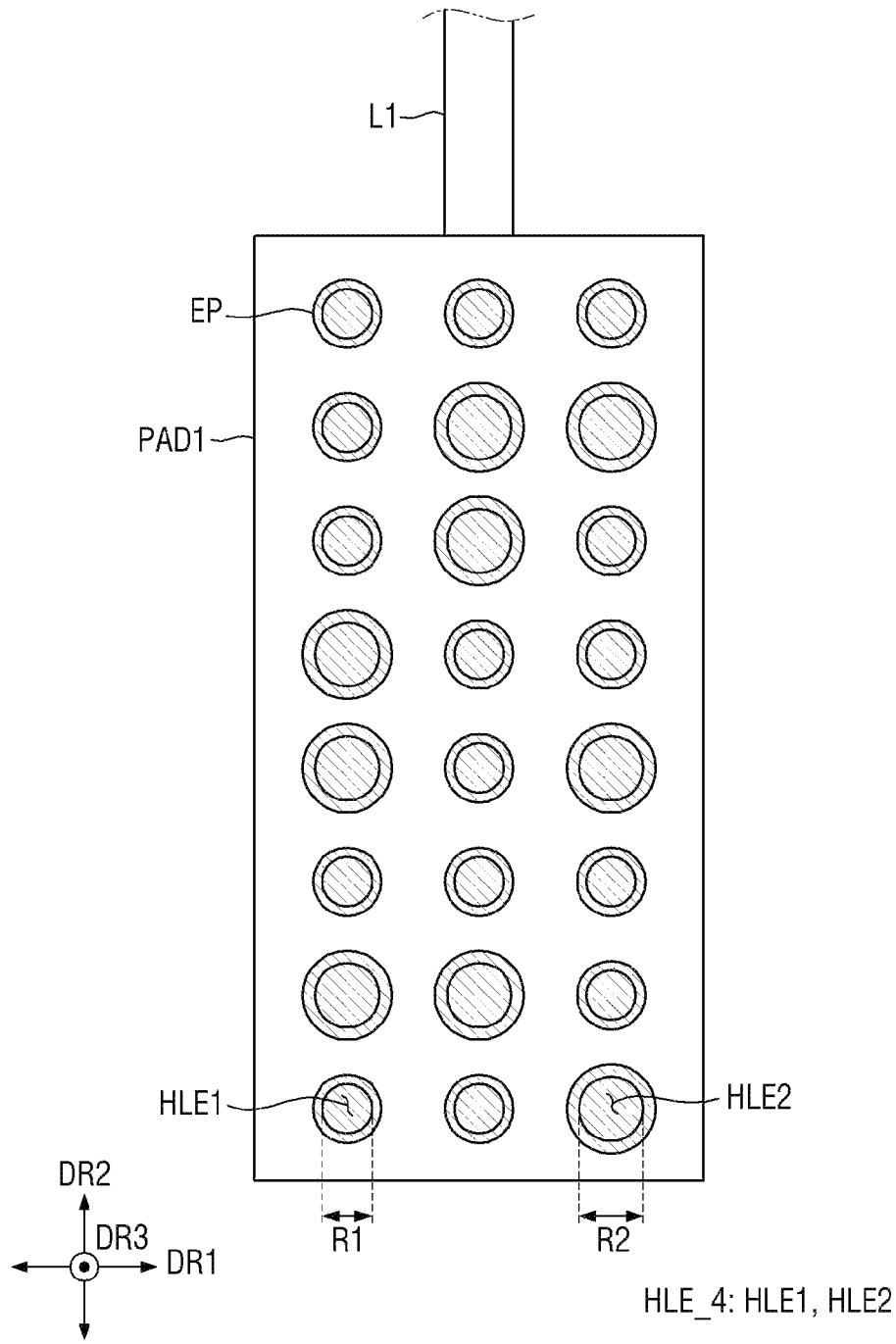
FIG. 15 is a schematic plan view of a display pad according to still another embodiment.

FIG. 15 is a schematic plan view of a display pad according to still another embodiment.

Referring to FIG. 15, an embodiment may be different from an embodiment of FIG. 10 at least in that through holes HLE_4 of the first display pad PAD1 may include first through holes HLE1 and second through holes HLE2 having different diameters. A first diameter R1 of the first through hole HLE1 may be smaller than a second diameter R2 of the second through hole HLE2. Protrusion patterns EP may fill the first through holes HLE1 and the second through holes HLE2 and protrude upward from the first through holes HLE1 and the second through holes HLE2.

The first display pad PAD1 has been described in FIG. 15, but a description for the first display pad PAD1 may also be applied to the second display pad PAD2 (see FIG. 8) and the third display pad PAD3 (see FIG. 8).

Also, a defect such as a lift of the protrusion pattern EP may be suppressed or prevented, and a crack or the like of the pad connection electrode PCE (see FIG. 11) disposed on the protrusion pattern EP may be suppressed or prevented, such that reliability of the display device may be improved. The through holes HLE_4 may be variously designed, such that a design capable of alleviating stress applied to the protrusion patterns EP as much as possible may be possible.

Figure 16:
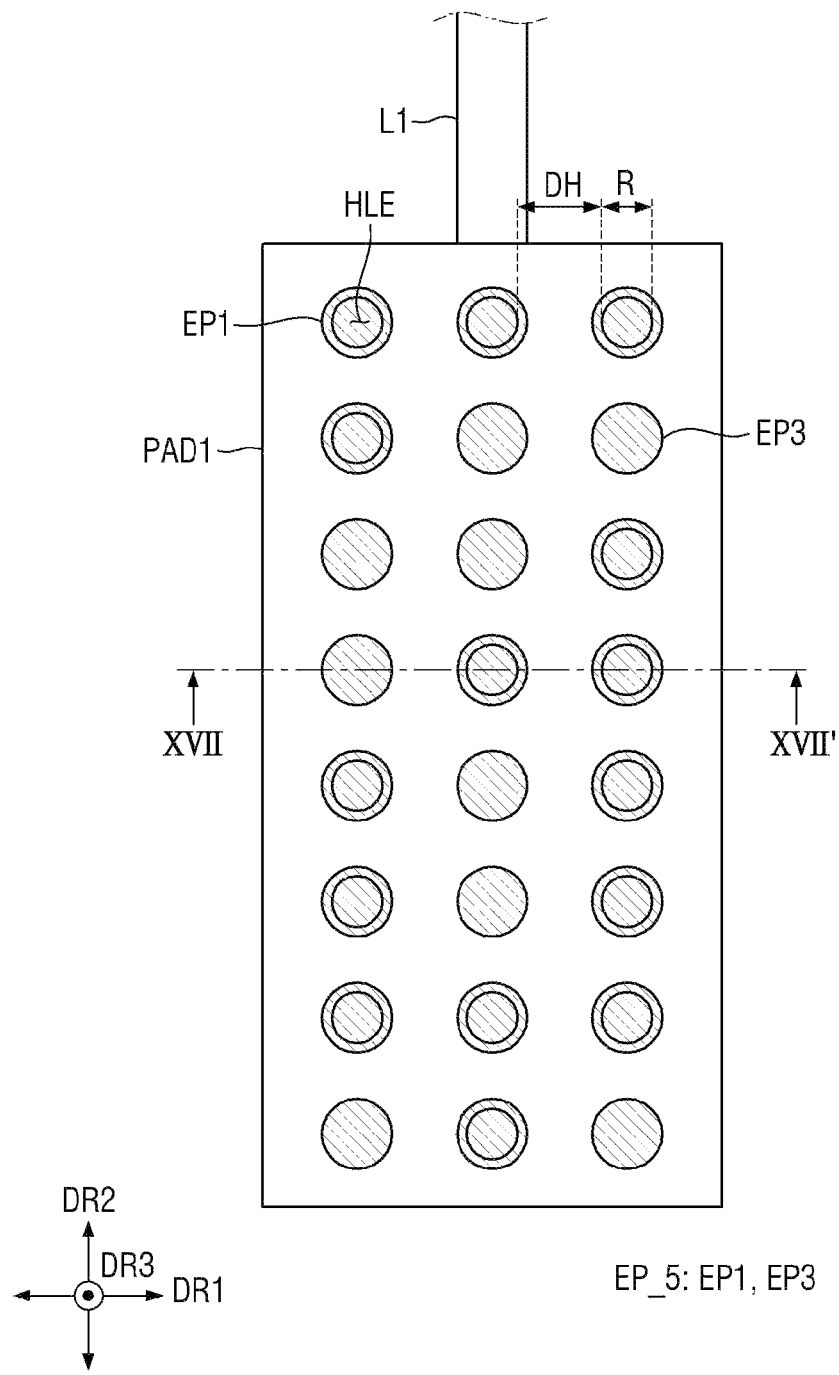
FIG. 16 is a schematic plan view of a display pad according to still another embodiment.

FIG. 16 is a schematic plan view of a display pad according to still another embodiment. FIG. 17 is a schematic cross-sectional view taken along line XVII-XVII' of FIG. 16.

Referring to FIGS. 16 and 17, an embodiment may be different from an embodiment of FIG. 10 at least in that multiple protrusion patterns EP_5 may be provided and at least some of the protrusion patterns EP_5 may be disposed on an upper surface of the first display pad PAD1. In other words, the protrusion patterns EP_5 may include first protrusion patterns EP1 overlapping the through holes HLE and filling the through holes HLE and third protrusion patterns EP3 disposed on the first display pad PAD1. The first protrusion patterns EP1 may be substantially the same as the protrusion patterns EP of FIG. 10. The third protrusion patterns EP3 may be disposed in portions where the through holes HLE may not be disposed. The third protrusion patterns EP3 may not fill the through holes HLE. The third protrusion patterns EP3 may overlap the first display pad PAD1 over the entire area thereof, and may be disposed on a surface (upper surface) of the first display pad PAD1.

The first display pad PAD1 has been described in FIGS. 16 and 17, but a description for the first display pad PAD1 may also be applied to the second display pad PAD2 (see FIG. 8) and the third display pad PAD3 (see FIG. 8).

Also, a defect such as a lift of the protrusion pattern EP_5 may be suppressed or prevented, and a crack or the like of the pad connection electrode PCE disposed on the protrusion pattern EP_5 may be suppressed or prevented, such that reliability of the display device may be improved. A layout of the through holes HLE and a layout of the protrusion patterns EP_5 may be variously designed, such that a design capable of alleviating stress applied to the protrusion patterns EP_5 as much as possible may be possible.

Figure 18:
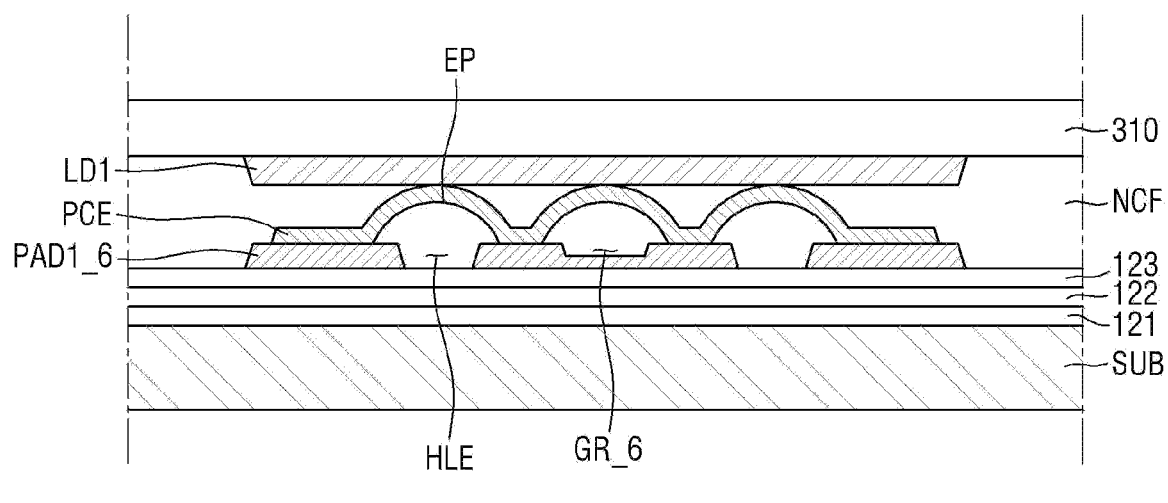
FIG. 18 is a schematic cross-sectional view of a display pad according to still another embodiment.
Figure 18:
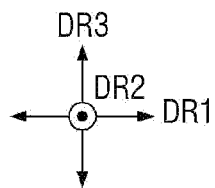

FIG. 18 is a schematic cross-sectional view of a display pad according to still another embodiment. The first display pad PAD1 has been described in FIG. 18, but a description for the first display pad PAD1 may also be applied to the second display pad PAD2 (see FIG. 8) and the third display pad PAD3 (see FIG. 8).

Referring to FIG. 18, an embodiment may be different from an embodiment of FIG. 11 at least in that a first display pad PAD1_6 may further include a pad groove GR_6. In other words, the first display pad PAD1_6 may define the pad groove GR_6 as well as the through holes HLE. The pad groove GR_6 may have a shape in which it may be recessed from a surface (upper surface) of the first display pad PAD1_6 toward the other surface (lower surface) of the first display pad PAD1_6. The pad groove GR_6 may be disposed to replace at least one of the through holes HLE illustrated in FIGS. 10 and 11. The protrusion patterns EP may fill the inside of the pad groove GR_6 as well as the insides of the through holes HLE, and may protrude from the through holes HLE and the pad groove GR_6.

Also, a defect such as a lift of the protrusion pattern EP may be suppressed or prevented, and a crack or the like of the pad connection electrode PCE disposed on the protrusion pattern EP may be suppressed or prevented, such that reliability of the display device may be improved. An amount of the protrusion pattern EP filling the pad groove GR_6 may be smaller than an amount of the protrusion pattern EP filling the through hole HLE, such that a process cost may be reduced.

Figure 19:
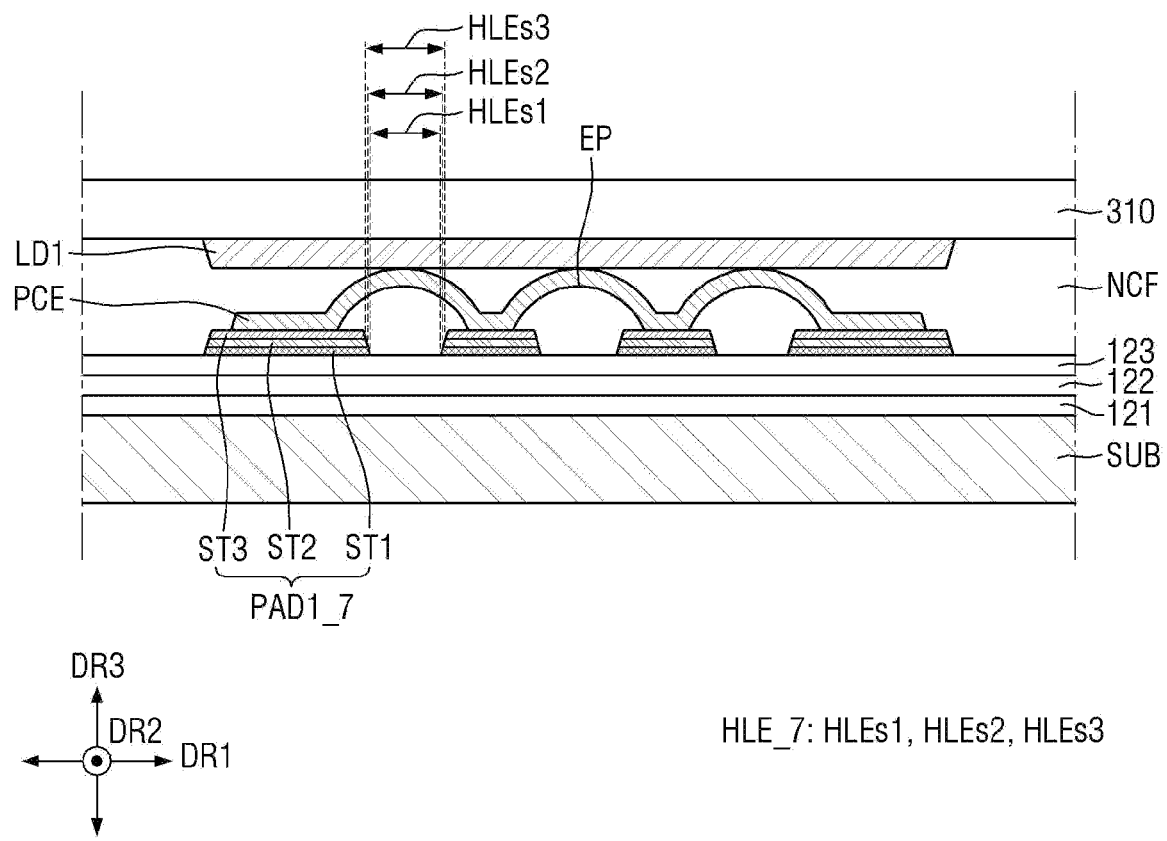
FIG. 19 is a schematic cross-sectional view of a display pad according to still another embodiment.

FIG. 19 is a schematic cross-sectional view of a display pad according to still another embodiment. The first display pad PAD1 has been described in FIG. 19, but a description for the first display pad PAD1 may also be applied to the second display pad PAD2 (see FIG. 8) and the third display pad PAD3 (see FIG. 8).

Referring to FIG. 19, an embodiment may be different from an embodiment of FIG. 11 at least in that a first display pad PAD1_7 may have multiple stacked structures. In other words, the first display pad PAD1_7 may include a first stacked conductive layer ST1, a second stacked conductive layer ST2, and a third stacked conductive layer ST3 that may be sequentially stacked on each other. The first stacked conductive layer ST1 may be formed of the third conductive layer 150 (see FIG. 5), the second stacked conductive layer ST2 may be formed of the fourth conductive layer 160 (see FIG. 5), and the third stacked conductive layer ST3 may be formed of the fifth conductive layer 170 (see FIG. 5), but the disclosure is not limited thereto.

Through holes HLE_7 may include first sub-through holes HLEs1, second sub-through holes HLEs2, and third sub-through holes HLEs3, respectively. The first sub-through hole HLEs1, the second sub-through hole HLEs2, and the third sub-through hole HLEs3 may overlap each other, and expose the third insulating layer 123 disposed thereunder.

The first sub-through hole HLEs1 may be defined by the first stacked conductive layer ST1. The first sub-through hole HLEs1 may penetrate through the first stacked conductive layer ST1 in the thickness direction (third direction DR3). The second sub-through hole HLEs2 may be defined by the second stacked conductive layer ST2. The second sub-through hole HLEs2 may penetrate through the second stacked conductive layer ST2 in the thickness direction (third direction DR3). The third sub-through hole HLEs3 may be defined by the third stacked conductive layer ST3. The third sub-through hole HLEs3 may penetrate through the third stacked conductive layer ST3 in the thickness direction (third direction DR3).

A diameter of the first sub-through hole HLEs1 may be smaller than that of the second sub-through hole HLEs2, and the diameter of the second sub-through hole HLEs2 may be smaller than that of the third sub-through hole HLEs3, but the disclosure is not limited thereto.

Also, a defect such as a lift of the protrusion pattern EP may be suppressed or prevented, and a crack or the like of the pad connection electrode PCE disposed on the protrusion pattern EP may be suppressed or prevented, such that reliability of the display device may be improved. The first display pad PAD1_7 has the stacked structures, such that a width of the through hole HLE_7 in the thickness direction (third direction DR3) may increase, and stress applied to the protrusion pattern EP in the vertical direction (thickness direction (third direction DR3)) may be more smoothly alleviated.

Figure 20:
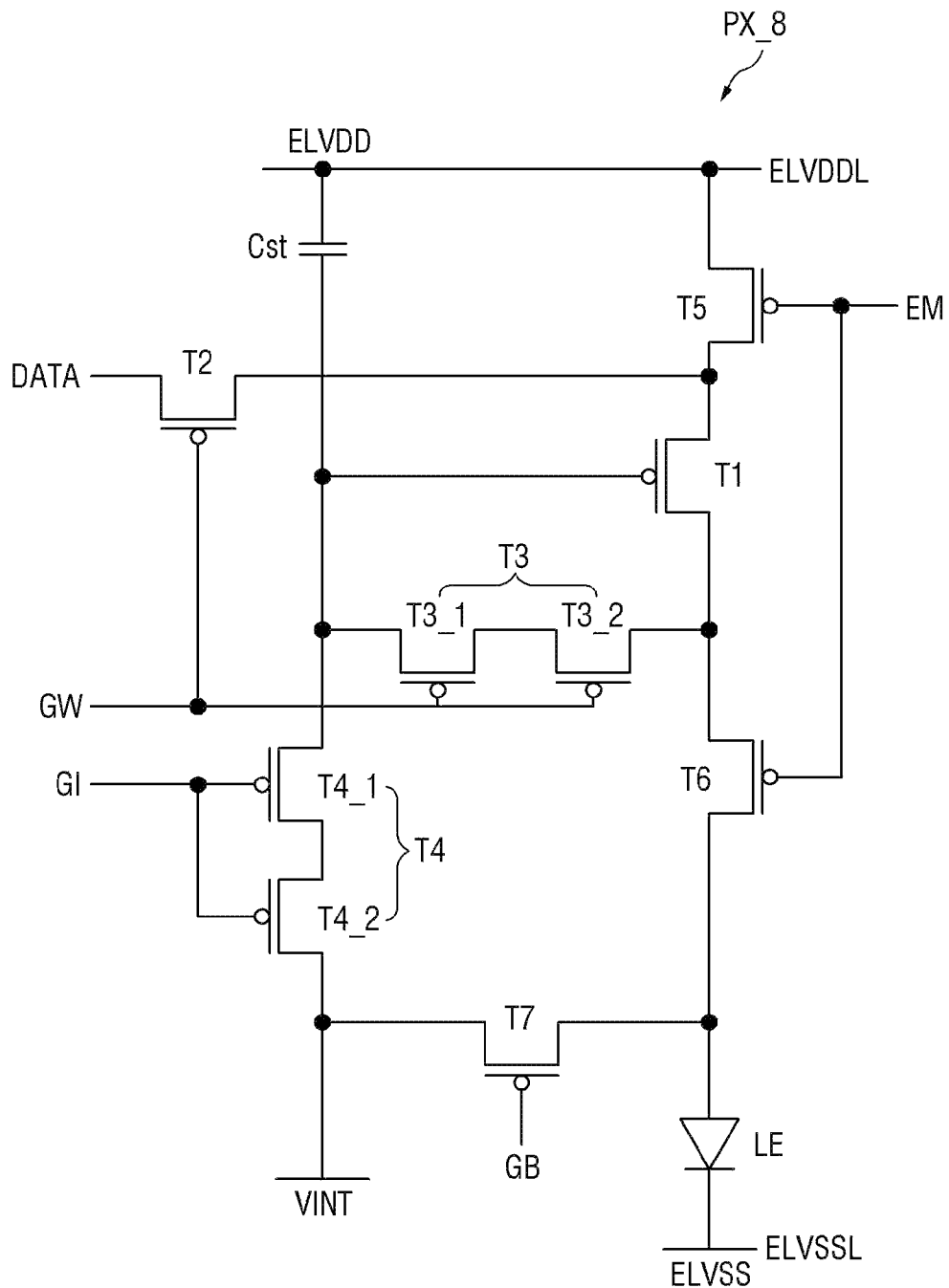
FIG. 20 is a schematic circuit diagram of a pixel of a display device according to another embodiment.

FIG. 20 is a schematic circuit diagram of a pixel of a display device according to another embodiment.

Referring to FIG. 20, an embodiment may be different from an embodiment of FIG. 3 at least in that a pixel PX_8 may include seven transistors T1, T2, T3, T4, T5, T6, and T7 and one maintaining capacitor CST, in addition to a light emitting element LE.

Specifically, a data signal DATA, a first scan signal GW, a second scan signal GI, a third scan signal GB, an emission control signal EM, a first source voltage ELVDD, a second source voltage ELVSS, and an initialization voltage VINT may be applied to a circuit of one pixel PX. A first transistor T1 may serve as a driving transistor, and second to seventh transistors T2 to T7 may function as switching transistors.

Hereinafter, respective components will be described in detail.

A gate electrode of the first transistor T1 may be connected to a first electrode of the capacitor Cst. The first electrode of the first transistor T1 may be connected to a first source voltage line ELVDDL for applying the first source voltage ELVDD via the fifth transistor T5. A second electrode of the first transistor T1 may be connected to an anode electrode of the light emitting element LE via the sixth transistor T6. The first transistor T1 may receive the data signal DATA according to a switching operation of the second transistor T2 and supply a driving current to the light emitting element LE.

A gate electrode of the second transistor T2 may be connected to a first scan signal line for applying the first scan signal GW. A first electrode of the second transistor T2 may be connected to a data signal DATA terminal. A second electrode of the second transistor T2 may be connected to the first electrode of the first transistor T1, and may be connected to the first source voltage line ELVDDL via the fifth transistor T5. The second transistor T2 may be turned on according to the first scan signal GW to perform a switching operation of transferring the data signal DATA to the first electrode of the first transistor T1.

The third transistor T3 may be formed as a dual transistor including a first sub-transistor T3_1 and a second sub-transistor T3_2. A gate electrode of the first sub-transistor T3_1 may be connected to the first scan signal line for applying the first scan signal GW, a first electrode of the first sub-transistor T3_1 may be connected to a second electrode of the second sub-transistor T3_2, and a second electrode of the first sub-transistor T31 may be connected to all of the first electrode of the capacitor Cst, a first electrode of a third sub-transistor T4_1, and the gate electrode of the first transistor T1. A gate electrode of the second sub-transistor T3_2 may be connected to the first scan signal line for applying the first scan signal GW, a first electrode of the second sub-transistor T3_2 may be connected to the second electrode of the first transistor T1, and the second electrode of the second sub-transistor T3_2 may be connected to the first electrode of the first sub-transistor T3_1.

The first sub-transistor T3_1 and the second sub-transistor T3_2 may be turned on by the first scan signal GW to connect the gate electrode and the second electrode of the first transistor T1 to each other, thereby diode-connecting the first transistor T1. Accordingly, a voltage difference may be generated between the first electrode and the gate electrode of the first transistor T1 by a threshold voltage of the first transistor T1, and a threshold voltage deviation of the first transistor T1 may be compensated for by supplying the data signal DATA in which the threshold voltage may be compensated for to the gate electrode of the first transistor T1.

The fourth transistor T4 may be formed as a dual transistor including the third sub-transistor T4_1 and a fourth sub-transistor T4_2. A gate electrode of the third sub-transistor T4_1 may be connected to a second scan signal line for applying the second scan signal GI, the first electrode of the third sub-transistor T4_1 may be connected to all of the first electrode of the capacitor Cst, the second electrode of the first sub-transistor T3_1, and the gate electrode of the first transistor T1, and a second electrode of the third sub-transistor T4_1 may be connected to a first electrode of the fourth sub-transistor T4_2. A gate electrode of the fourth sub-transistor T4_2 may be connected to the second scan signal line for applying the second scan signal GI, the first electrode of the fourth sub-transistor T4_2 may be connected to the second electrode of the third sub-transistor T4_1, and a second electrode of the fourth sub-transistor T4_2 may be connected to an initialization voltage line for applying the initialization voltage VINT. The third sub-transistor T4_1 and the fourth sub-transistor T4_2 may be turned on by the second scan signal GI to transfer the initialization voltage VINT to the gate electrode of the first transistor T1, thereby initializing a voltage of the gate electrode of the first transistor T1.

A gate electrode of the fifth transistor T5 may be connected to an emission control signal line for applying the emission control signal EM, a first electrode of the fifth transistor T5 may be connected to the first source voltage line ELVDDL, and a second electrode of the fifth transistor T5 may be connected to the first electrode of the first transistor T1. The fifth transistor T5 may be turned on by the emission control signal EM to connect the first electrode of the first transistor T1 and the first source voltage line ELVDDL to each other.

The sixth transistor T6 may be connected between the second electrode of the first transistor T1 and a first electrode of the light emitting element LE. A gate electrode of the sixth transistor T6 may be connected to the emission control signal line for applying the emission control signal EM, a first electrode of the sixth transistor T6 may be connected to the second electrode of the first transistor T1 and the first electrode of the second sub-transistor T3_2, and a second electrode of the sixth transistor T6 may be connected to the first electrode of the light emitting element LE.

The fifth transistor T5 and the sixth transistor T6 may be simultaneously turned on according to the emission control signal EM, and accordingly, the driving current flows to the light emitting element LE.

A gate electrode of the seventh transistor T7 may be connected to a third scan signal line for applying the third scan signal GB. A first electrode of the seventh transistor T7 may be connected to the anode electrode of the light emitting element LE. A second electrode of the seventh transistor T7 may be connected to the initialization voltage line for applying the initialization voltage VINT. The seventh transistor T7 may be turned on according to the third scan signal GB to initialize the anode electrode of the light emitting element LE.

A case where the third scan signal GB may be applied to the gate electrode of the seventh transistor T7 has been described as an embodiment, but in another embodiment, a circuit of the pixel PX may also be configured so that the emission control signal EM or the second scan signal GI may be applied to the gate electrode of the seventh transistor T7.

The capacitor Cst may be formed between the gate electrode of the first transistor T1 and the first source voltage line ELVDDL, and may include the first electrode and a second electrode. The first electrode of the capacitor Cst may be connected together to all of the gate electrode of the first transistor T1, the second electrode of the first sub transistor T3_1, and the first electrode of the third sub transistor T4_1, and the second electrode of the capacitor Cst may be connected to the first source voltage line ELVDDL. The capacitor Cst may serve to keep a data voltage applied to the gate electrode of the first transistor T1 constant.

A cathode electrode of the light emitting element LE may be connected to a second source voltage line ELVSSL for applying the second source voltage ELVSS. The light emitting element LE may receive the driving current from the first transistor T1 and emit light to display an image.

Hereinafter, application examples of the display device 10 according to an embodiment will be described with reference to FIGS. 21 to 24, but the application examples of the display device 10 are not limited thereto.

Figure 21:
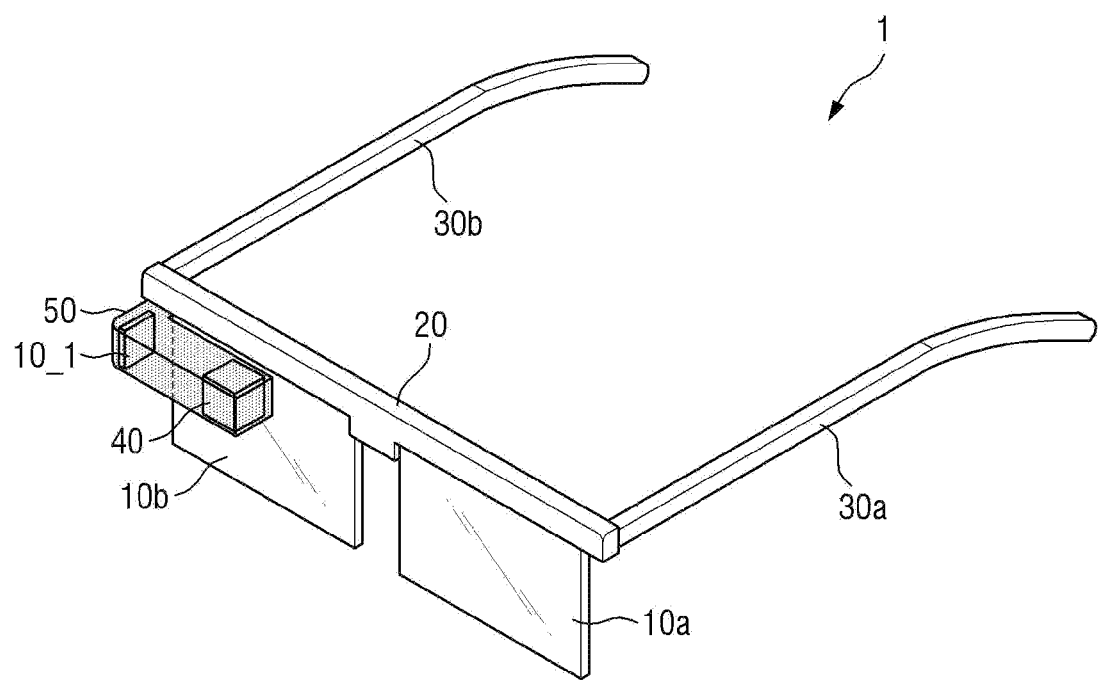
FIG. 21 is a schematic view illustrating a virtual reality device including the display device according to an embodiment.

FIG. 21 is a schematic view illustrating a virtual reality device including the display device according to an embodiment. A virtual reality device 1 to which a display device 10-1 according to an embodiment may be applied is illustrated in FIG. 21.

Referring to FIG. 21, the virtual reality device 1 according to an embodiment may be a glasses-type device. The virtual reality device 1 according to an embodiment may include the display device 10-1, a left eye lens 10a, a right eye lens 10b, a support frame 20, eyeglass frames legs 30a and 30b, a reflective member 40, and a display device accommodating part 50.

The virtual reality device 1 including the eyeglass frame legs 30a and 30b has been illustrated in FIG. 21, but the virtual reality device 1 according to an embodiment may also be applied to a head mounted display including a head mounted band that may be mounted on a user's head instead of the eyeglass frame legs 30a and 30b. For example, the virtual reality device 1 according to an embodiment is not limited to that illustrated in FIG. 21, and may be applied in various forms to various other electronic devices.

The display device accommodating part 50 may include the display device 10_1 and the reflective member 40. An image displayed on the display device 10_1 may be reflected by the reflective member 40 and provided to a user's right eye through the right eye lens 10b. Accordingly, a user may view a virtual reality image displayed on the display device 10_1 through his/her right eye.

It has been illustrated in FIG. 21 that the display device accommodating part 50 may be disposed at a right distal end of the support frame 20, but embodiments of the disclosure are not limited thereto. For example, the display device accommodating part 50 may be disposed at a left distal end of the support frame 20. An image displayed on the display device 10_1 may be reflected by the reflective member 40 and provided to a user's left eye through the left eye lens 10a. Accordingly, the user may view a virtual reality image displayed on the display device 10_1 through his/her left eye. In other embodiments, the display device accommodating parts 50 may be disposed at both the left and right distal ends of the support frame 20. The user may view a virtual reality image displayed on the display device 10_1 through both his/her left and right eyes.

Figure 22:
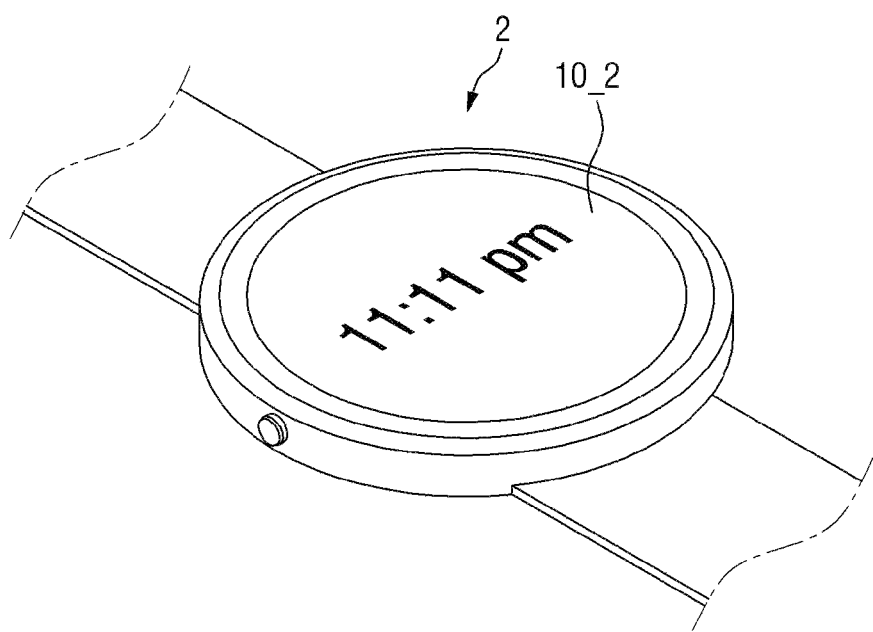
FIG. 22 is a schematic view illustrating a smart device including the display device according to an embodiment.

FIG. 22 is a schematic view illustrating a smart device including the display device according to an embodiment.

Referring to FIG. 22, a display device 10_2 according to an embodiment may be applied to a smartwatch 2, which may be one of the smart devices.

Figure 23:
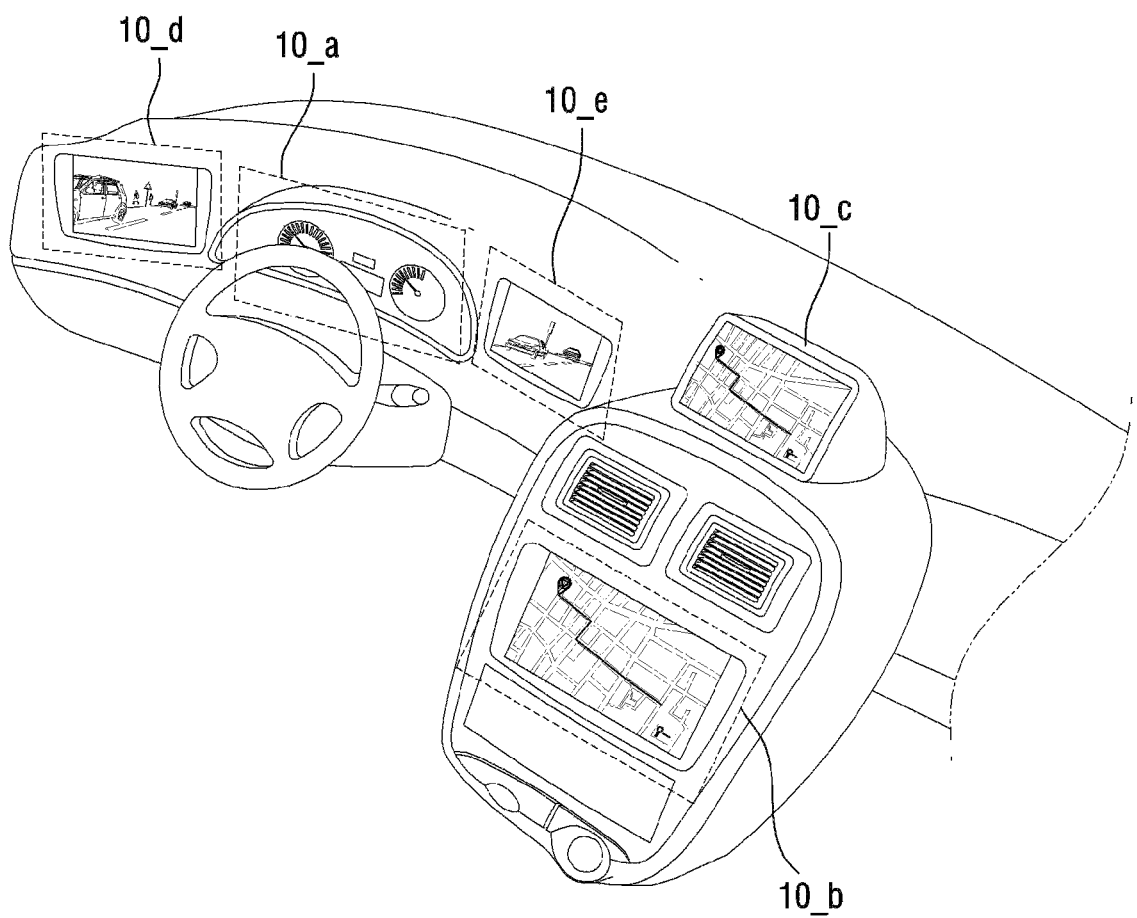
FIG. 23 is a schematic view illustrating an instrument board and a center fascia of a vehicle including the display device according to an embodiment.

FIG. 23 is a schematic view illustrating an instrument board and a center fascia of a vehicle including the display device according to an embodiment. A vehicle to which display devices 10_a, 10_b, 10_c, 10_d, and 10_e according to an embodiment may be applied is illustrated in FIG. 23.

Referring to FIG. 23, the display devices 10_a, 10_b, and 10_c according to an embodiment may be applied to an instrument board of the vehicle, applied to a center fascia of the vehicle, or applied to a center information display (CID) disposed on a dashboard of the vehicle. The display device 10_d and 10_e according to an embodiment may be applied to a room mirror display substituting for a side mirror of the vehicle.

Figure 24:
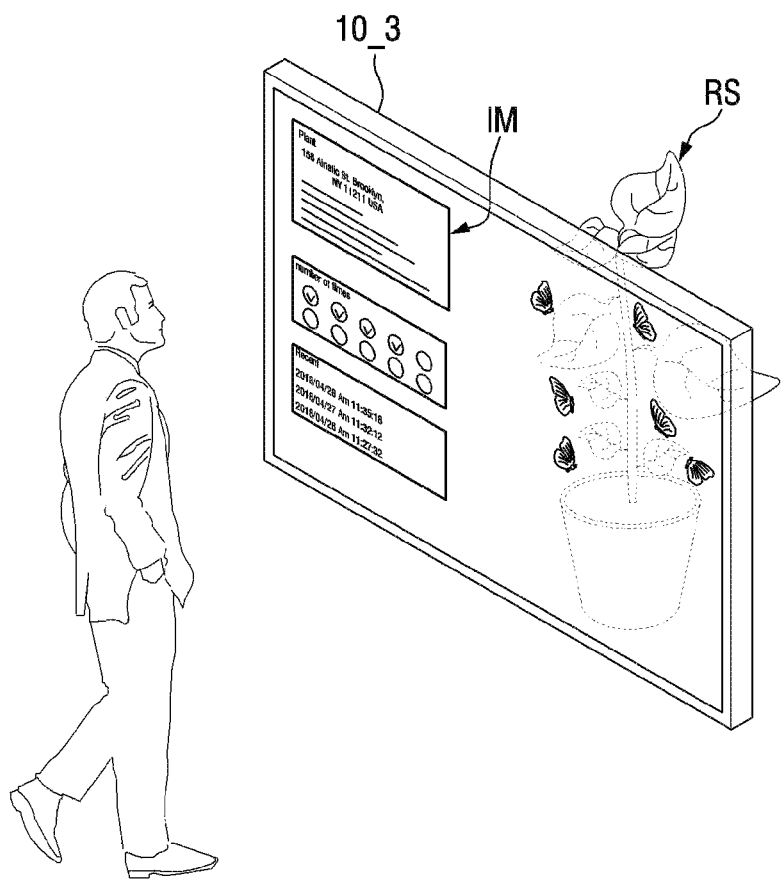
FIG. 24 is a schematic view illustrating a transparent display device including the display device according to an embodiment.

FIG. 24 is a schematic view illustrating a transparent display device including the display device according to an embodiment.

Referring to FIG. 24, a display device 10_3 according to an embodiment may be applied to a transparent display device. The transparent display device may transmit light while displaying an image IM. Therefore, a user positioned on a front surface of the transparent display device may not only view the image IM displayed on the display device 10_3, but also see an object RS or a background positioned on a rear surface of the transparent display device. In case that the display device 10_3 is applied to the transparent display device, the first substrate SUB1 of the display device 10_3 illustrated in FIGS. 4 and 5 may include a light transmitting part capable of transmitting light or may be formed of a material capable of transmitting light.

However, embodiments of the disclosure are not restricted to those set forth herein. The above and other modified embodiments are apparent to one of ordinary skill in the art to which the disclosure pertains. All such embodiments are considered to be within the scope of the disclosure.

What is claimed is:

1. A display device comprising:
a display pad disposed on a substrate and including through holes penetrating the display pad in a thickness direction of the substrate, the through holes being enclosed within an outer periphery of the display pad in a view in the thickness direction;
at least one first protrusion pattern filling the through holes and protruding above the display pad;
a pad connection pattern having first portions overlapping both the at least one first protrusion pattern and the through holes, respectively, in the thickness direction and second portions spaced apart from each other by the first portions and electrically connected to the display pad, the first portions above the second portions in a thickness direction; and
a connection lead of a circuit board, the connection lead being disposed on the pad connection pattern, overlapping both the at least one first protrusion pattern and the through holes in the thickness direction, and being electrically connected to the pad connection pattern based on directly contacting the first portions.

2. The display device of claim 1, wherein
the at least one first protrusion pattern includes a plurality of first protrusion patterns.

3. The display device of claim 2, wherein one or more of the through holes has a rectangular shape in a plan view.

4. The display device of claim 1, wherein
the at least one first protrusion pattern includes a plurality of first protrusion patterns, and
at least one of the plurality of first protrusion patterns fills insides of the plurality of through holes.

5. The display device of claim 1, wherein the throug holes include:
a first through hole having a first diameter; and
a second through hole having a second diameter greater than the first diameter.

6. The display device of claim 1, further comprising:
a second protrusion pattern disposed on the display pad, the second protrusion pattern not overlapping at least one of the through holes.

7. The display device of claim 1, wherein
the display pad includes a pad groove having a shape recessed from a surface of the display pad towards another surface of the display pad, and
the at least one first protrusion pattern fills the pad groove and protrudes above the display pad.

8. The display device of claim 1, wherein
the display pad includes:
a first stacked conductive layer and a second stacked conductive layer that are sequentially stacked on each other, and
the through holes include:
a first sub-through hole in the first stacked conductive layer; and
a second sub-through hole in the second stacked conductive layer.

9. The display device of claim 1, further comprising:
a first emission area emitting light of a first color;
a second emission area emitting light of a second color; and
at least one light emitting element disposed in each of the first emission area and the second emission area,
wherein the display pad includes:
a first display pad electrically connected to the at least one light emitting element disposed in the first emission area; and
a second display pad electrically connected to the at least one light emitting element disposed in the second emission area.

10. The display device of claim 9, wherein
the first display pad includes a first conductive layer, and
the second display pad includes a second conductive layer.

11. The display device of claim 10, further comprising:
a third emission area emitting light of a third color; and
a light emitting element disposed in the third emission area, wherein
the display pad further includes a third display pad electrically connected to the light emitting element disposed in the third emission area, and
the third display pad includes a third conductive layer.

12. The display device of claim 9, further comprising:
a display area displaying a screen; and
a non-display area disposed adjacent to the display area, wherein
the first emission area and the second emission area are disposed in the display area, and
the display pad is disposed in the non-display area.

13. The display device of claim 9, wherein the at least one light emitting element includes a plurality of light emitting elements.

14. The display device of claim 13, wherein each of the at least one light emitting element is a micro light emitting diode element.

15. A display device comprising:
a substrate including a display area and a peripheral area disposed outside the display area;
a first emission area disposed on the display area and emitting light of a first color;
a second emission area disposed on the display area and emitting light of a second color;
at least one light emitting element disposed in each of the first emission area and the second emission area; and a display pad disposed on the peripheral area, the display pad including:
  a first display pad electrically connected to the at least one light emitting element disposed in the first emission area; and
  a second display pad electrically connected to the at least one light emitting element disposed in the second emission area, wherein
each of the first display pad and the second display pad includes at least one through hole penetrating in a thickness direction,
the first display pad is formed of a first conductive layer,
the second display pad is formed of a second conductive layer different from the first conductive layer,
in association with the display area:
  the first conductive layer is disposed closer to the substrate than the second conductive layer; and
  both the first conductive layer and the second conductive layer overlap a same layer as each other in the thickness direction, and
in association with the peripheral area, both the first conductive layer and the second conductive layer are disposed directly on and above the same layer.

16. The display device of claim 15, further comprising a protrusion pattern filling the at least one through hole and protruding above the display pad.

17. The display device of claim 16, wherein
the at least one through hole is provided in plural,
the at least one protrusion pattern is provided in plural, and
each protrusion pattern fills each through hole.

18. The display device of claim 16, further comprising:
  a pad connection pattern overlapping the protrusion pattern and electrically connected to the display pad; and
  a connection lead of a circuit board, the connection lead being disposed on the pad connection pattern and electrically connected to the pad connection pattern.

19. The display device of claim 15, wherein the at least one light emitting element includes a plurality of light emitting elements.

20. The display device of claim 19, wherein each of the at least one light emitting element is a micro light emitting diode element.

21. An electronic device comprising:
  a display pad disposed on a substrate and including through holes penetrating the display pad in a thickness direction of the substrate, the through holes being enclosed within an outer periphery of the display pad in a view in the thickness direction;
  at least one first protrusion pattern filling the through holes and protruding above the display pad;
  a pad connection pattern having first portions overlapping both the at least one first protrusion pattern and the through holes in the thickness direction and second portions spaced apart from each other by the first portions and electrically connected to the display pad, the first portions above the second portions in a thickness direction; and
  a connection lead of a circuit board, the connection lead being disposed on the pad connection pattern, overlapping both the at least one first protrusion pattern and the through holes in the thickness direction, and being electrically connected to the pad connection pattern based on directly contacting the first portions.

* * * * *